US012166052B2

(12) United States Patent
Cho et al.

(10) Patent No.: US 12,166,052 B2
(45) Date of Patent: Dec. 10, 2024

(54) OPTOELECTRIC DEVICE AND ELECTRONIC DEVICE INCLUDING THE SAME

(71) Applicant: SAMSUNG ELECTRONICS CO., LTD., Suwon-si (KR)

(72) Inventors: Kyungsang Cho, Gwacheon-si (KR); Hojung Kim, Suwon-si (KR); Chanwook Baik, Yongin-si (KR); Yooseong Yang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 402 days.

(21) Appl. No.: 17/580,145

(22) Filed: Jan. 20, 2022

(65) Prior Publication Data

US 2023/0028578 A1 Jan. 26, 2023

(30) Foreign Application Priority Data

Jul. 20, 2021 (KR) ........................ 10-2021-0095155

(51) Int. Cl.
*H01L 27/146* (2006.01)
*B82Y 20/00* (2011.01)

(52) U.S. Cl.
CPC ........ *H01L 27/14621* (2013.01); *B82Y 20/00* (2013.01)

(58) Field of Classification Search
None
See application file for complete search history.

(56) References Cited

U.S. PATENT DOCUMENTS 6,294,794 B1 * 9/2001 Yoshimura ............ H01L 29/127 257/14
9,048,376 B2 6/2015 Lin et al.
9,385,194 B2 7/2016 Cho et al.
10,529,883 B2 1/2020 Damjanovic et al.
2014/0008614 A1 1/2014 Fujii et al.
2014/0225063 A1 * 8/2014 Klem ..................... H10K 71/10 257/14
2015/0364628 A1 12/2015 Nozawa et al.
(Continued)

FOREIGN PATENT DOCUMENTS

KR 10-1874413 B1 7/2018
KR 10-2019-0079111 A 7/2019

OTHER PUBLICATIONS

Ning et al. "Graded Doping for Enhanced Colloidal Quantum Dot Photovoltaics" (Adv. Mater. 2013, 25, 1719-1723) (Year: 2013).*
(Continued)

*Primary Examiner* — Xiaoming Liu
(74) *Attorney, Agent, or Firm* — Sughrue Mion, PLLC

(57) ABSTRACT

Provided is an image sensor including a sensor array including a plurality of light-sensors respectively including an optoelectronic device, the optoelectronic device including a first electrode, a second electrode spaced apart from the first electrode, and an active layer provided between the first electrode and the second electrode, the active layer including a plurality of quantum dot layers having different energy bands, and a circuit including circuits respectively connected to the plurality of light-sensors and configured to readout an optoelectronic signal generated from each of the plurality of light-sensors.

22 Claims, 28 Drawing Sheets

(56) References Cited

U.S. PATENT DOCUMENTS

| | | | |
|---|---|---|---|
| 2018/0019371 A1 | 1/2018 | Steckel et al. | |
| 2018/0240921 A1 † | 8/2018 | Nakayama | |
| 2018/0254421 A1 | 9/2018 | Kinge et al. | |
| 2019/0198796 A1 | 6/2019 | Kim et al. | |
| 2020/0091359 A1 * | 3/2020 | Hosokawa | H01L 31/0325 |
| 2022/0344906 A1 * | 10/2022 | Tarumi | H01S 5/4043 |

OTHER PUBLICATIONS

Georgitzikis, E., et al., "Optimization of Charge Carrier Extraction in Colloidal Quantum Dots Short-Wave Infrared Photodiodes through Optical Engineering", Advanced Functional Materials, Adv. Funct. Mater. 2018, 28, 1804502, 8 pages. https://doi.org/10.1002/adfm.201804502.

Lee, J., et al., "Imaging in Short-Wave Infrared with 1.82 μm Pixel Pitch Quantum Dot Image Sensor" 2020 IEEE International Electron Devices Meeting (IEDM), 4 pages. DOI: 10.1109/IEDM13553.2020.9372018.

Song, J.H., et al. "Energy level tuned indium arsenide colloidal quantum dot films for efficient photovoltaics", Nature Communications, (2018)9:4267, 9 pages. DOI: 10.1038/s41467-018-06399-4.

Mocatta, D., et al. "Heavily Doped Semiconductor Nanocrystal Quantum Dots" Science, vol. 332, (6025), pp. 77-81. (Apr. 1, 2011), 6 pages. DOI: 10.1126/science.1196321.

Communication issued Aug. 9, 2022 by the European Patent Office in European Patent Application No. 22161018.1.

Jung Hoon Song et al., "Energy level tuned indium arsenide colloidal quantum dot films for efficient photovoltaics", Nature Communications, 2018, DOI: 10.1038/s41467-018-06399-4, www.nature.com/naturecommunications, (9 pages total).

Communication dated Feb. 8, 2024, issued by the European Patent Office in European Application No. 22161018.1.

Stavrinadis, Alexandros, et al. "Heterovalent cation substitutional doping for quantum dot homojunction solar cells", nature Communications, 4:2981, Dec. 18, 2013. pp 1-7.†

Park, Dasom, et al., "Cascaded band alignments of PbS heterojunction layers for improved performance of PbS quantum dot solar cells", Solar Energy Materials &Solar Cells, 208, 2020. pp. 1-8.†

Ning, Zhijun, et al., "Graded Doping for Enhanced Colloidal Quantum Dot Photovoltaics", Advanced Materials, vol. 25, 2013, pp. 1719-1723.†

Ackerman, Matthew M. et al., "Fast and Sensitive Colloidal Quantum Dot Mid-Wave Infrared Photodetectors", ACS Nano XXXX, XXX, XXX-XXX, DOI: 10.1021 acsnano.8b03425, Jul. 2018, 9 pages.†

Sun, Bin, et al., "Sub-nanosecond Infrared Photodetection using III-V Colloidal Quantum Dots", DOI: https://doi.org/10.21203/rs.3.rs-92318/v1, Nov. 20, 2020, 22 pages.†

Pejovic, Vladimir, et al. "Thin-Film Photodetector Optimization for High-Performance Short-Wavelength Infrared Imaging", IEEE Electron Device Letters, vol. 42, No. 8, Aug. 2021. pp. 1196-1199.†

Song, Jung Hoon, et al. "Energy level tuned indium arsenide colloidal quantum dot films for efficient photovoltaics". nature Communications, 9:4267, 2018, pp. 1-9.†

Ko, Dong-Kyun , et al., "p-i-n-Heterjunction Solar Cells with a Colloidal Quantum-Dot Absorber Layer", Advanced Materials, DOI 10:1002, 2014, pp. 1-6.†

* cited by examiner
† cited by third party

OPTOELECTRIC DEVICE AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0095155, filed on Jul. 20, 2021, in the Korean Intellectual Property Office, the disclosure of which is incorporated by reference herein in its entirety.

BACKGROUND

1. Field

Example embodiments of the present disclosure relate to an optoelectronic device and an electronic device including the same.

2. Description of Related Art

Quantum dots (QD) are nanocrystals of a semiconductor material having a nano size and are materials exhibiting a quantum confinement effect.

Colloidal quantum dots exhibit different band gaps depending on their sizes due to the quantum confinement effect at the nano size, and by utilizing these characteristics, are used in various light-emitting devices and light-receiving devices. For example, quantum dots are being applied to light-emitting devices such as QD-TVs, QD-LEDs, QD-displays, etc., or light-receiving devices such as QD-photodetectors and QD-solar cells.

In a light-receiving device, a quantum dot layer is used as an absorption layer, and when the quantum dots absorb light energy, a photocarrier is generated in the quantum dot layer. In a path where such a photocarrier is extracted to the outside of the quantum dot layer, the photocarrier may disappear due to carrier recombination, which causes a reduction in efficiency. Therefore, a solution for increasing the efficiency of extracting charges generated in the quantum dot layer by light energy to the outside is being sought.

SUMMARY

One or more example embodiments provide an optoelectronic device with improved optoelectronic efficiency.

One or more example embodiments provide an electronic device using an optoelectronic device.

Additional aspects will be set forth in part in the description which follows and, in part, will be apparent from the description, or may be learned by practice of example embodiments of the disclosure.

According to an aspect of an example embodiment, there is provided an optoelectronic device including a first electrode, a second electrode spaced apart from the first electrode, and an active layer provided between the first electrode and the second electrode, the active layer including a plurality of quantum dot layers having different energy bands, the active layer comprising a p-type first quantum dot layer and an n-type second quantum dot layer.

The plurality of quantum dot layers may include a same quantum dot material.

The plurality of quantum dot layers may be doped with different dopants.

One layer of the plurality of quantum dot layers may be doped with a certain dopant, and other layers of the plurality of quantum dot layers may be undoped.

The plurality of quantum dot layers may include different quantum dot materials.

The optoelectronic device may further comprises an electron transport layer provided between the first electrode and the active layer; and a hole transport layer provided between the active layer and the second electrode.

A thickness of the active layer may range from 250 nm to 350 nm.

A thickness of the electron transport layer and a thickness of the hole transport layer may range from 10 nm to 100 nm.

A thickness of the electron transport layer may range from 20 nm to 60 nm, and a thickness of the hole transport layer may range from 20 nm to 35 nm.

The active layer may further include an intrinsic-type (i-type) third quantum dot layer provided between the p-type first quantum dot layer and the n-type second quantum dot layer.

The optoelectronic device of claim may further comprise an electron transport layer provided between the first electrode and the active layer; and a hole transport layer provided between the active layer and the second electrode.

A thickness of the active layer may range from 300 nm to 600 nm.

A thickness of the electron transport layer may range from 20 nm to 30 nm, and a thickness of the hole transport layer may range from 20 nm to 50 nm.

The active layer may further include a p-type fourth quantum dot layer provided between the p-type first quantum dot layer and the i-type third quantum dot layer, a doping concentration of the p-type fourth quantum dot layer being lower than a doping concentration of the p-type first quantum dot layer, and an n-type fifth quantum dot layer provided between the i-type third quantum dot layer and the n-type second quantum dot layer, a doping concentration of the n-type fifth quantum dot layer being lower than a doping concentration of the n-type second quantum dot layer.

The active layer may further include a p-type fourth quantum dot layer provided between the p-type first quantum dot layer and the n-type second quantum dot layer, a doping concentration of the p-type fourth quantum dot layer being lower than a doping concentration of the p-type first quantum dot layer, and an n-type fifth quantum dot layer provided between the p-type fourth quantum dot layer and the n-type second quantum dot layer, a doping concentration of the n-type fifth quantum dot layer being lower than a doping concentration of the n-type second quantum dot layer.

One of the first electrode and the second electrode may include a transparent conductive material.

One layer of the plurality of quantum dot layers may be doped with a metal ion, a ligand material, or an inorganic ion passivation.

A diameter of a quantum dot included in each of the plurality of quantum dot layers may range from 1 nm to 10 nm.

The active layer may form a photocarrier based on light of a visible, near-infrared or infrared wavelength band.

According to another aspect of an example embodiment, there is provided an image sensor including a sensor array including a plurality of light-sensors respectively including an optoelectronic device, the optoelectronic device including a first electrode, a second electrode spaced apart from the first electrode, and an active layer provided between the first electrode and the second electrode, the active layer including a plurality of quantum dot layers having different energy bands, the active layer comprising a p-type first quantum dot layer and an n-type second quantum dot layer, wherein external quantum efficiency is 25% or higher, and a circuit including circuits respectively connected to the plurality of light-sensors and configured to readout an optoelectronic signal generated from each of the plurality of light-sensors.

According to another aspect of an example embodiment, there is provided an electronic device including an imaging device configured to form an optical image by focusing light reflected from a subject, and an image sensor configured to convert the optical image formed by the imaging device into an electrical signal, the image sensor including a sensor array including a plurality of light-sensors respectively including an optoelectronic device, the optoelectronic device including a first electrode, a second electrode spaced apart from the first electrode, and an active layer provided between the first electrode and the second electrode, the active layer including a plurality of quantum dot layers having different energy bands, the active layer comprising a p-type first quantum dot layer and an n-type second quantum dot layer, wherein external quantum efficiency is 25% or higher, and a circuit including circuits respectively connected to the plurality of light-sensors and configured to readout an optoelectronic signal generated from each of the plurality of light-sensors.

The electronic device may include a smart phone, a mobile phone, a personal digital assistant (PDA), a laptop, a personal computer (PC), a home appliance, a security camera, a medical camera, a vehicle, an Internet of Things (IoT) device, a virtual reality device, or an augmented reality device.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
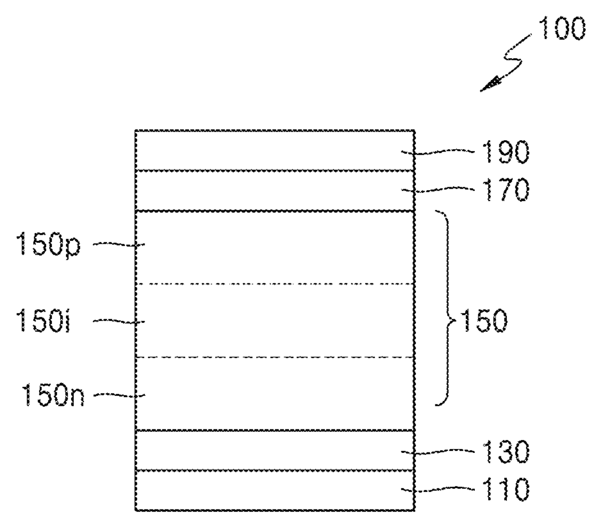
FIG. 1 is a cross-sectional view showing a structure of an optoelectronic device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described in detail with reference to the accompanying drawings. Example embodiments described below are merely examples and various modifications may be made therein. In the drawings, the same reference numerals represent the same elements, and a size of each element may be exaggerated for clarity and convenience of description.

It will be understood that when one element is referred to as being “on” or “above” another element, the element may be on the other element in direct contact with the other element or without contacting the other element.

The terms ‘first’, ‘second,’ etc. may be used to describe various elements but are only used herein to distinguish one element from another element. These terms are not intended to limit materials or structures of elements.

As used herein, the singular expressions are intended to include plural forms as well, unless the context clearly dictates otherwise. It will be understood that when an element is referred to as “including” another element, the element may further include other elements unless mentioned otherwise.

Terms such as “unit”, “module,” and the like, when used herein, represent units for processing at least one function or operation, which may be implemented by hardware, software, or a combination of hardware and software.

The term “the” and demonstratives similar thereto may be understood to include both singular and plural forms.

Unless explicitly stated that operations of a method should be performed in an order described below, the operations may be performed in an appropriate order. In addition, all terms indicating examples (e.g., etc.) are only for the purpose of describing technical ideas in detail, and thus the scope of the present disclosure is not limited by these terms unless limited by the claims.

FIG. 1 is a cross-sectional view showing a structure of an optoelectronic device 100 according to an example embodiment.

The optoelectronic device 100 includes a first electrode 110, a second electrode 190 spaced apart from the first electrode 110, and an active layer 150 disposed between the first electrode 110 and the second electrode 190, and including a plurality of quantum dot layers of different energy bands. An electron transport layer (ETL) 130 may be disposed between the first electrode 110 and the active layer 150, and a hole transport layer (HTL) 170 may be disposed between the second electrode 190 and the active layer 150.

The active layer 150 may include a p-type first quantum dot layer 150*p*, an n-type second quantum dot layer 150*n*, and an intrinsic (i)-type third quantum dot layer 150*i* disposed between the first quantum dot layer 150*p* and the second quantum dot layer 150*n*.

Quantum dots provided in the active layer 150 may be, for example, colloidal quantum dots formed using a colloidal solution. The quantum dot may be a nano-size structure including a semiconductor (an inorganic semiconductor). The quantum dot may have a diameter equal to or less than several tens of nm, for example, a diameter equal to or less than about 10 nm. The quantum dot may include, for example, at least one of a group II-VI series semiconductor, a group III-V series semiconductor, a group IV-VI series semiconductor, a group IV series semiconductor, and a graphene quantum dot.

The II-VI series semiconductor may include, for example, a binary compound such as ZnS, ZnSe, ZnTe, CdS, CdSe, CdTe, ZnO, HgS, HgSe, and HgTe, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe, and a quaternary compound such as CdHgZnTe, CdZnSeS, CdZnSeTe, CdZnSTe, CdHgSeS, CdHgSeTe, CdHgSTe, HgZnSeS, HgZnSeTe, and HgZnSTe, or a combination thereof.

The III-V series semiconductor may include, for example, a binary compound such as GaN, GaP, GaAs, GaSb, AlN, AlP, AlAs, AlSb, InN, InP, InAs, and InSb, a ternary compound such as GaNP, GaNAs, GaNSb, GaPAs, GaPSb, AlNP, AlNAs, AlNSb, AlPAs, AlPSb, InNP, InNAs, InNSb, InPAs, and InPSb, and a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb, or a combination thereof.

The IV-VI series semiconductor may include, for example, a binary compound such as SnS, SnSe, SnTe, PbS, PbSe, and PbTe, a ternary compounds such as SnSeS, SnSeTe, SnSTe, PbSeS, PbSeTe, PbSTe, SnPbS, SnPbSe, and SnPbTe, and a quaternary compound such as SnPbSSe, SnPbSeTe, and SnPbSTe, or a combination thereof.

The group IV-series semiconductor may include, for example, Si, Ge, SiGe, and SiC, or a combination thereof. Meanwhile, the graphene quantum dot may be a quantum dot including graphene. In addition, the quantum dot may have a core-shell structure having a core portion and a shell portion, or may have a particle structure without a shell (i.e., a core-only structure). The core-shell structure may include a single-shell or a multi-shell. The multi-shell may be, for example, a double-shell. In addition, the quantum dot may include an alloy, and in some cases, may be doped with a certain dopant. An organic ligand or an inorganic ligand may be present on a surface of the quantum dot.

The first quantum dot layer 150*p*, the second quantum dot layer 150*n*, and the third quantum dot layer 150*i* constituting the active layer 150 may include the same quantum dot material among the above-described quantum dot materials. The first quantum dot layer 150*p*, the second quantum dot layer 150*n*, and the third quantum dot layer 150*i* may be doped with different dopants, or only some layers may be doped with a certain dopant and the remaining layers may not be doped.

When the quantum dot material provided in the first quantum dot layer 150*p*, the second quantum dot layer 150*n*, and the third quantum dot layer 150*i* is essentially n-type, such as InAs, the second quantum dot layer 150*n* may not be doped, and the first quantum dot layer 150*p* and the third quantum dot layer 150*i* may be doped with a p-type dopant and may become respectively p-type and i-type by controlling doping concentrations differently from each other. The second quantum dot layer 150*n* may be additionally doped with an n-type dopant.

When the quantum dot material provided in the first quantum dot layer 150*p*, the second quantum dot layer 150*n*, and the third quantum dot layer 150*i* is essentially p-type, such as PbS, the first quantum dot layer 150*p* may not be doped, and the second quantum dot layer 150*n* and the third quantum dot layer 150*i* may be doped with an n-type dopant, and may become respectively n-type and i-type by controlling doping concentrations differently from each other. The first quantum dot layer 150*p* may be additionally doped with a p-type dopant.

All or two or more of the first quantum dot layer 150*p*, the second quantum dot layer 150*n*, and the third quantum dot layer 150*i* may include different quantum dot materials among the above-described quantum dot materials. The first quantum dot layer 150*p*, the second quantum dot layer 150*n*, and the third quantum dot layer 150*i* may each include a material suitable for p-type, n-type, and i-type, and may be doped with an appropriate dopant if necessary.

The doping described above may include, for example, metal ion doping, ligand material doping, or inorganic ion passivation doping.

The first quantum dot layer 150*p* may be set to have a p-type concentration such that a significant p-i junction is formed in relation to the third quantum dot layer 150*i*. For example, the first quantum dot layer 150*p* may have a concentration equal to or greater than $10^{15}/cm^2$. Similarly, the second quantum dot layer 150*n* may be set to have an n-type concentration such that a significant i-n junction is formed in relation to the third quantum dot layer 150*i*. For example, the second quantum dot layer 150*n* may have a concentration equal to or greater than $10^{15}/cm^2$.

The diameter of the quantum dots included in the first quantum dot layer 150*p*, the second quantum dot layer 150*n*, and the third quantum dot layer 150*i* constituting the active layer 150 may be in the range of about 1 nm to about 10 nm. The diameter of the quantum dots is related to the operating wavelength of the optoelectronic device 100, that is, the wavelength band of incident light in which the active layer 150 absorbs light energy and generates photocarriers. The operating wavelength band may be adjusted by adjusting the diameter of the quantum dots. The size of the quantum dots may be determined so that the active layer 150 may form photocarriers in response to light of, for example, a visible or near infrared or infrared wavelength band.

The first electrode 110 and the second electrode 190 may include a conductive material. Any one of the first electrode 110 and the second electrode 190 may include a transparent electrode material. As the transparent electrode material, a transparent conductive oxide (TCO) such as indium tin oxide (ITO), indium zinc oxide (IZO), aluminum zinc oxide (AZO), or gallium zinc oxide (GZO) may be used. In addition, Al, Mo, Ag, Au, Ca, Ba, carbon nanotube (CNT), graphene, etc. may be used as the conductive material. In addition, various metals, conductive compounds (oxide), etc. may be used for the first electrode 110 and the second electrode 190.

The ETL 130 may be provided between the first electrode 110 and the active layer 150. The ETL 130 may include an inorganic semiconductor. The inorganic semiconductor may be an n-type semiconductor. The inorganic semiconductor may include, for example, Zn oxide ($ZnO_x$), Ti oxide ($TiO_x$), Sn oxide ($SnO_x$), Zr oxide ($ZrO_x$), or n-GaN. The specific materials of the inorganic semiconductor presented here are examples, and various other inorganic semiconductor materials may be applied. The ETL 130 may include an n-type organic semiconductor. The ETL 130 may have a general thin film shape or a layer structure including a plurality of nanostructures. The plurality of nanostructures may be, for example, nanoparticles. The ETL 130 may be amorphous or polycrystalline, and in some cases, may have a mixed phase of amorphous and polycrystalline.

The HTL 170 may be provided between the active layer 150 and the second electrode 190. The HTL 170 may include an organic semiconductor. The organic semiconductor may be a p-type semiconductor. The organic semiconductor may include a low-molecular or polymer-based organic material. The HTL 170 may include a p-type inorganic semiconductor.

The total thickness of the active layer 150 may be in the range of about 200 nm to about 600 nm. The first quantum dot layer 150*p* and the second quantum dot layer 150*n* may have the same thickness, but are not limited thereto. Each of the first quantum dot layer 150*p*, the second quantum dot layer 150*n*, and the third quantum dot layer 150*i* may have a thickness of about 40 nm to about 300 nm, but is not limited thereto.

The thickness of each of the HTL 170 and the ETL 130 may be in the range of about 10 nm to about 100 nm, but is not limited thereto.

The thicknesses are related to efficiency (e.g., external quantum efficiency) during an operation of the optoelectronic device 100, and an appropriate thickness combination capable of increasing the efficiency may be selected.

For example, the external quantum efficiency of the optoelectronic device 100 may be 25% or higher. The external quantum efficiency of the optoelectronic device 100 may be or 30% or higher, or 35% or higher.

For example, the thickness of the active layer 150 may range from 300 nm to 600 nm. The thickness of the electron transport layer 130 may range from 20 nm to 30 nm, and the thickness of the hole transport layer 170 may range from 20 nm to 50 nm.

Figure 2:
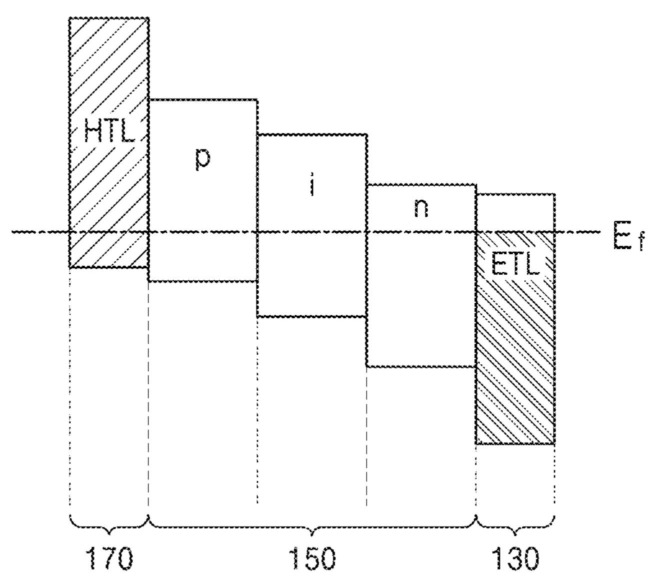
FIG. 2 shows an energy band of the optoelectronic device of FIG. 1.
Figure 3:
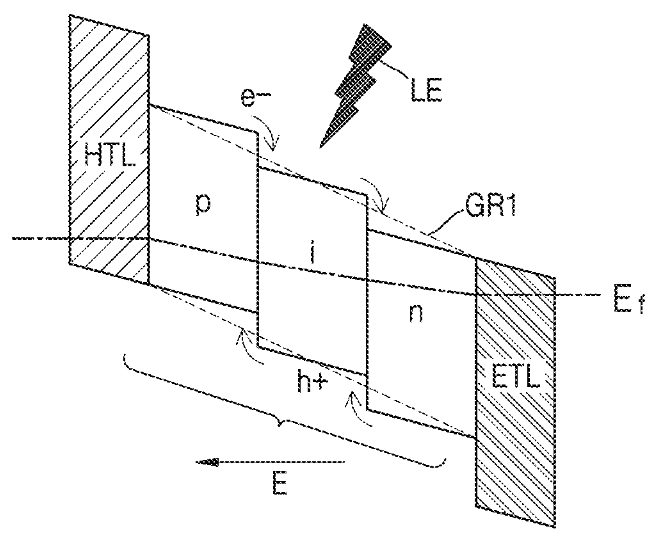
FIG. 3 is a conceptual diagram illustrating an energy band when a reverse bias voltage is applied to the optoelectronic device of FIG. 1 and movement of electrons and holes generated by light energy incident on the optoelectronic device.

FIG. 2 shows an energy band of the optoelectronic device 100 of FIG. 1, and FIG. 3 is a conceptual diagram illustrating an energy band when a reverse bias voltage is applied to the optoelectronic device 100 of FIG. 1 and movement of electrons (e−) and holes (h+) generated by light energy incident on the optoelectronic device 100.

The p-type first quantum dot layer 150*p*, the i-type third quantum dot layer 150*i*, and the n-type second quantum dot layer 150*n* form a discontinuous energy band in the active layer 150. This type of energy band increases an effective internal electric field compared to when the active layer 150 has a constant energy level.

When a reverse bias voltage is applied to the optoelectronic device 100, that is, so that the first electrode 110 has a higher electric potential than that of the second electrode 190, an electric field E is formed in a direction from the first electrode 110 toward the second electrode 190. The electrons (e−) and the holes (h+) formed when the active layer 150 absorbs light energy LE move in illustrated directions according to the electric field E. For example, the electrons (e−) move from the first quantum dot layer 150*p* to the third quantum dot layer 150*i*, and from the third quantum dot layer 150*i* to the second quantum dot layer 150*n*, and the holes (h+) move from the second quantum dot layer 150*n* to the third quantum dot layer 150*i*, and from the third quantum dot layer 150*i* to the first quantum dot layer 150*p*. The movement of electrons (e−) and holes (h+) in the active layer 150 may include a movement according to the electric field E and a movement by diffusion mechanism. The movement according to the electric field E is also referred to as a drift movement. The diffusion movement is disadvantageous in terms of transfer speed or efficiency compared to the drift movement, and the more dominant the drift movement during the movement in the active layer 150, the higher the efficiency. The optoelectronic device 100 according to an example embodiment includes a p−1 junction region and an i-n junction region in the active layer 150, so that the drift movement may occur in most of regions in the active layer 150. This may be expressed as a wide effective active region or a large effective electric field formed in the active layer 150. A gradient GR1 indicated by the dotted line conceptually shows the effective electric field formed in the active layer 150 according to the illustrated energy band. As the gradient GR1 increases, charges formed in the active layer 150 may be efficiently extracted to the outside.

Figure 4:
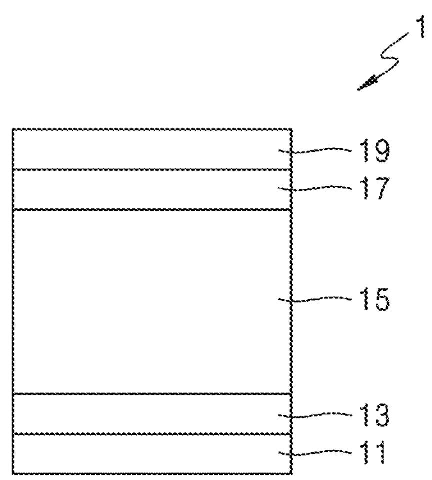
FIG. 4 is a cross-sectional view illustrating a structure of an optoelectronic device according to a related example.

FIG. 4 is a cross-sectional view illustrating a structure of the optoelectronic device 1 according to a related example.

Figure 5:
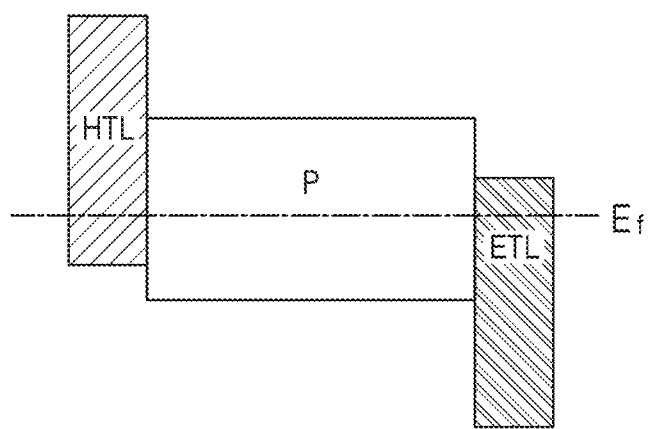
FIG. 5 shows an energy band of the optoelectronic device of FIG. 4.
Figure 6:
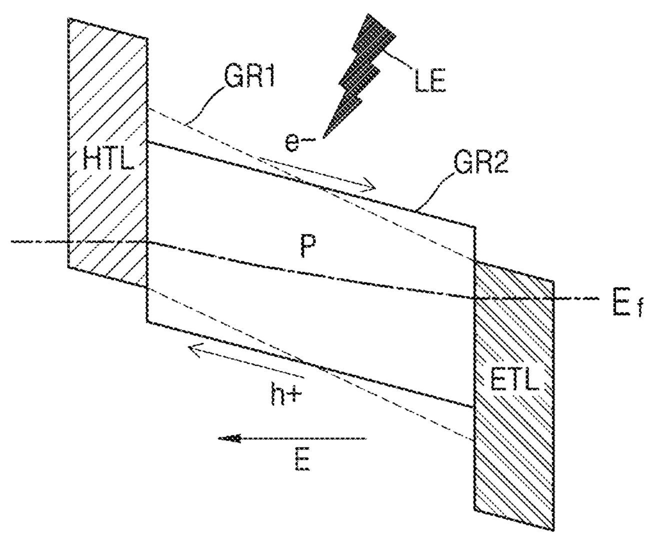
FIG. 6 is a conceptual diagram illustrating an energy band when a reverse bias voltage is applied to the optoelectronic device of FIG. 4 and movement of electrons and holes generated by light energy incident on the optoelectronic device.

FIG. 5 shows an energy band of the optoelectronic device 1 of FIG. 4, and FIG. 6 is a conceptual diagram illustrating an energy band when a reverse bias voltage is applied to the optoelectronic device 1 of FIG. 4 and movement of electrons (e−) and holes (h+) generated by light energy incident on the optoelectronic device 1.

The optoelectronic device 1 includes a first electrode 11, an ETL 13, an active layer 15, a HTL 17, and a second electrode 19. The active layer 15 has a constant energy level and may include p-type or n-type quantum dots. When a reverse bias voltage is applied to the optoelectronic device 1, the electric field E is formed in a direction from the first electrode 11 to the second electrode 19, and the electrons (e−) and the holes (h+) formed in the active layer 15 move toward the ETL 13 and the HTL 17, respectively. A gradient GR2 indicated by the solid line conceptually shows an effective electric field formed in the active layer 15.

The gradient GR2 is lower than the gradient GR1 indicated by the dotted line according to the example embodiment, which conceptually indicates that the effective electric field in the active layer 15 is lower than the effective electric field of the example embodiment. Accordingly, a transfer efficiency of charges is also lower than a transfer efficiency of charges in the example embodiment. Such a low efficiency in the optoelectronic device 1 of the related example is estimated because, in a reverse bias, a depletion region is not formed inside the active layer 15, but is formed at an interface between the active layer 15 and the ETL 13 or the active layer 15 and the HTL 17. For example, when the active layer 15 is a p-type quantum dot layer, the depletion region is formed at the interface between the active layer 15 and the ETL 13. Among regions of the active layer 15, photocarriers generated in the depletion region drift in a direction of the electric field E, but in the remaining region, the photocarriers may disappear due to carrier recombination. According to another example embodiment, it may be estimated that a movement of the photocarriers in the remaining region is a movement according to diffusion mechanism, and thus a transfer rate is slow and thus the efficiency is low. In the case of the related example, a region in which the photocarriers drift is limited to a part of a region in which the photocarriers are generated, and thus the efficiency appears low.

Figure 7:
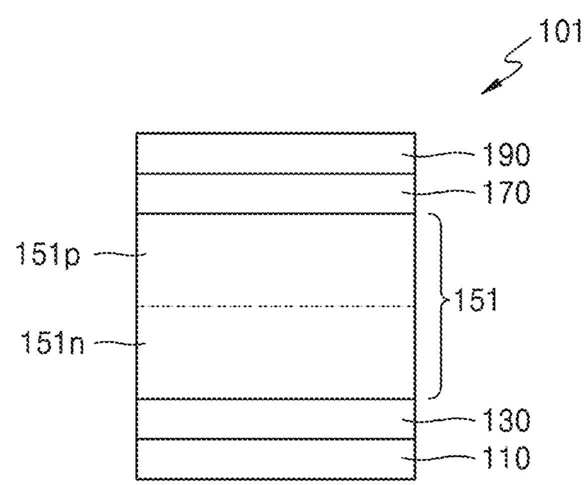
FIG. 7 is a cross-sectional view showing a structure of an optoelectronic device according to another example embodiment.
Figure 8:
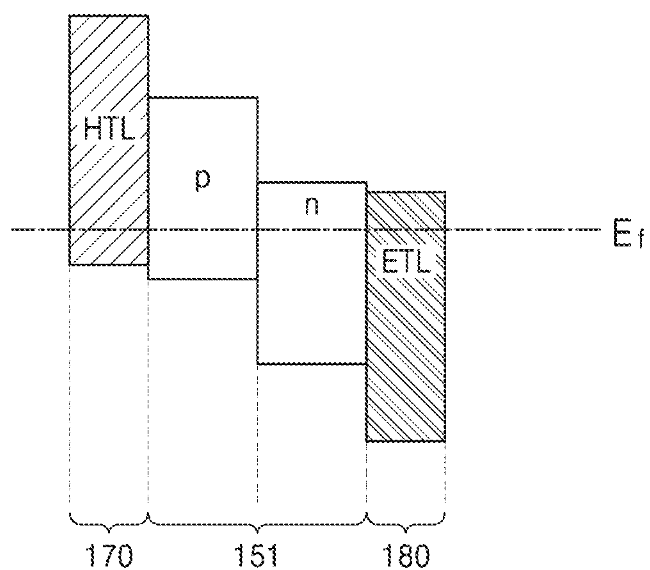
FIG. 8 shows an energy band of the optoelectronic device of FIG. 7.

FIG. 7 is a cross-sectional view showing a structure of an optoelectronic device 101 according to another example embodiment, and FIG. 8 shows an energy band of the optoelectronic device 101 of FIG. 7.

The optoelectronic device 101 is different from the example embodiment of FIG. 1 in that an active layer 151 includes a p-type first quantum dot layer 151*p* and an n-type second quantum dot layer 151*n*. A discontinuous energy band may be formed by a p-n junction formed in the active layer 151, and an effective internal electric field may be increased. Concentrations of the p-type first quantum dot layer 151*p* and the n-type second quantum dot layer 151*n* may be equal to or greater than $10^{15}/cm^2$ so that a significant energy band difference appears.

The external quantum efficiency of the optoelectronic device 101 may be 25% or higher. The external quantum efficiency of the optoelectronic device may be or 30% or higher, or 35% or higher.

The thickness of the active layer 151 may be in the range of about 200 nm to about 600 nm. The thickness of the active layer 151 may range from 300 nm to 600 nm. The thickness of the electron transport layer and a thickness of the hole transport layer ranges from 10 nm to 100 nm. The thickness of the electron transport layer 130 may range from 20 nm to 60 nm, and the thickness of the hole transport layer 170 may range from 20 nm to 35 nm.

Figure 9:
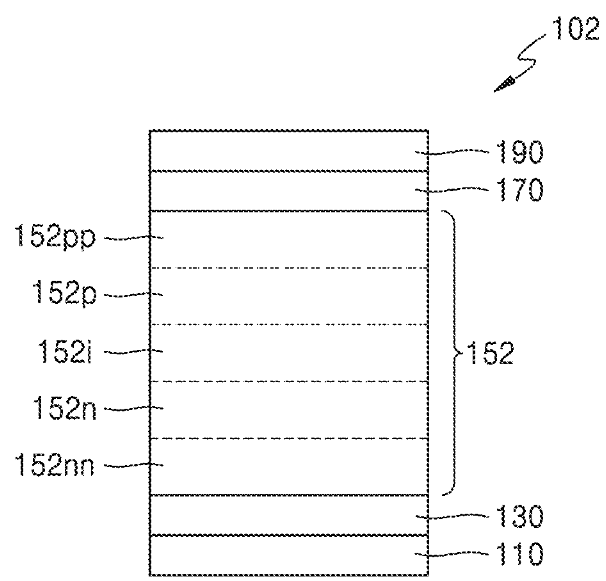
FIG. 9 is a cross-sectional view showing a structure of an optoelectronic device according to another example embodiment.
Figure 10:
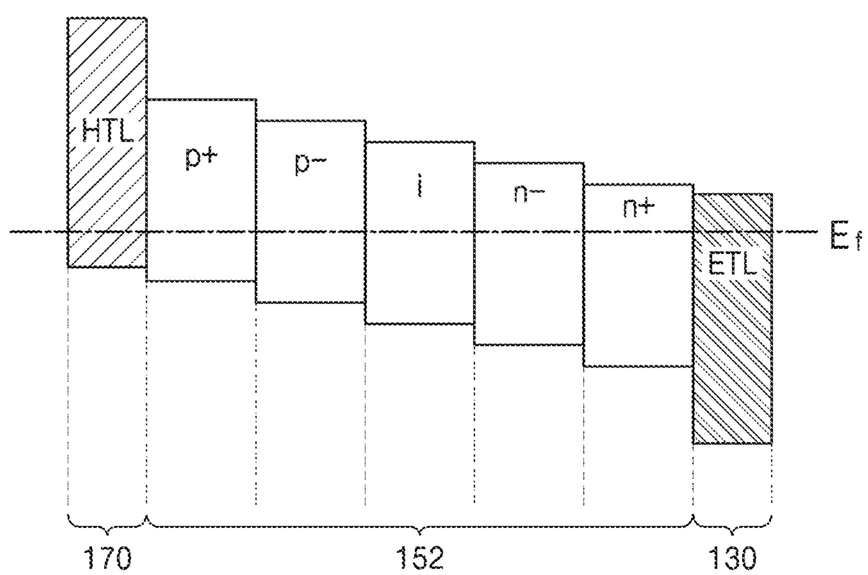
FIG. 10 shows an energy band of the optoelectronic device of FIG. 9.

FIG. 9 is a cross-sectional view showing the structure of an optoelectronic device 102 according to another example embodiment, and FIG. 10 shows an energy band of the optoelectronic device 102 of FIG. 9.

The optoelectronic device 102 is different from the example embodiment of FIG. 1 in that an active layer 152 includes a p-type first quantum dot layer 152*pp*, a p-type fourth quantum dot layer 152*p*, an n-type second quantum dot layer 152*nn*, an n-type fifth quantum dot layer 152*n*, an i-type third quantum dot layer 152*i*. The first quantum dot layer 152*pp* has a higher doping concentration than that of the fourth quantum dot layer 152*p*. The concentration of a p-type dopant in the first quantum dot layer 152*pp* and the fourth quantum dot layer 152*p* may be equal to or greater than $10^{15}/cm^2$. The concentration of the first quantum dot layer 152*pp* may be more than twice a ratio of the doping concentration of the fourth quantum dot layer 152*p*. The concentration of the first quantum dot layer 152*pp* may be equal to or greater than $10^{16}/cm^2$. The second quantum dot layer 152*nn* has a higher doping concentration than that of the fifth quantum dot layer 152*n*. The concentration of an n-type dopant in the second quantum dot layer 152*nn* and the fifth quantum dot layer 152*n* may be equal to or greater than $10^{15}/cm^2$. The concentration of the second quantum dot layer 152*nn* may be greater than or equal to twice the concentration of the fifth quantum dot layer 152*n*. The concentration of the second quantum dot layer 152*nn* may be equal to or greater than $10^{16}/cm^2$. According to such a concentration gradient, from the HTL 170 toward the ETL 130, an energy band that changes stepwise to p+, p−, i, n−, and n+ is formed. By this energy band, it is expected that an efficiency that is similar to or improved compared to the embodiment of FIG. 1 will be achieved.

Figure 11:
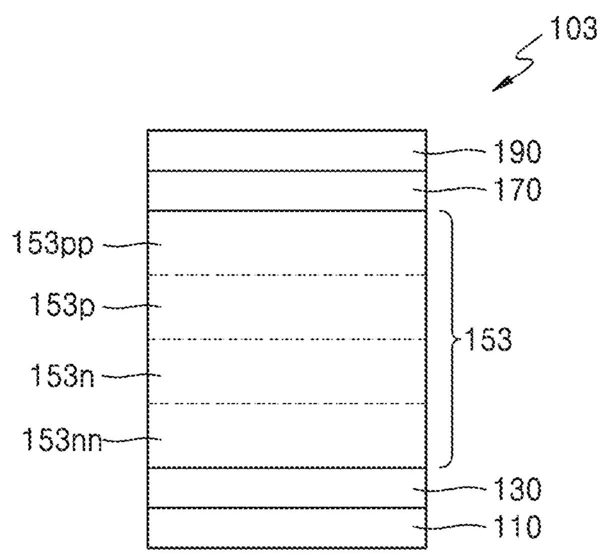
FIG. 11 is a cross-sectional view showing a structure of an optoelectronic device according to another example embodiment.
Figure 12:
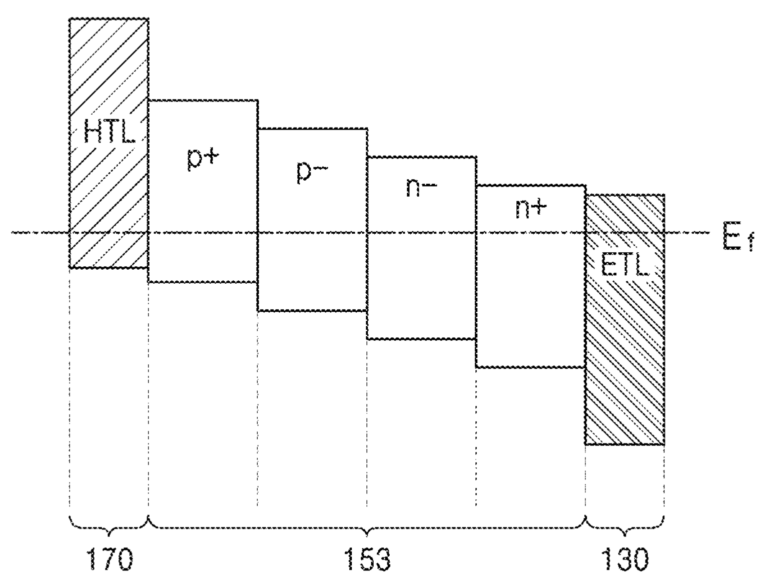
FIG. 12 shows an energy band of the optoelectronic device of FIG. 11.

FIG. 11 is a cross-sectional view showing a structure of an optoelectronic device 103 according to another example embodiment, and FIG. 12 shows an energy band of the optoelectronic device 103 of FIG. 11.

The optoelectronic device 103 of the example embodiment includes an active layer 153 including a p-type first quantum dot layer 153*pp*, a p-type fourth quantum dot layer 153*p*, an n-type second quantum dot layer 153*nn* and an n-type fifth quantum dot layer 153*n*. The first quantum dot layer 153*pp* has a higher doping concentration than that of the fourth quantum dot layer 153*p*, and the second quantum dot layer 153*nn* has a higher doping concentration than that of the fifth quantum dot layer 153*n*. According to such a concentration gradient, from the HTL 170 toward the ETL 130, an energy band that change stepwise to p+, p−, n−, and n+ is formed. By this energy band, it is expected that an efficiency that is similar to or improved compared to the example embodiment of FIG. 7 will be achieved.

Figure 13:
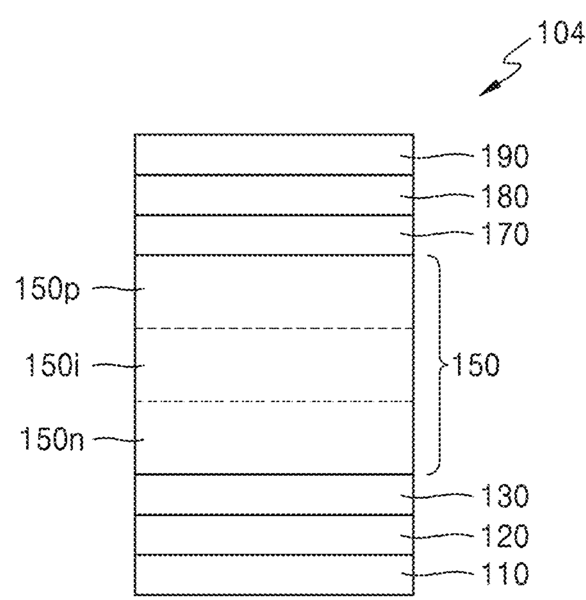
FIG. 13 is a cross-sectional view showing a structure of an optoelectronic device according to another example embodiment.

FIG. 13 is a cross-sectional view illustrating a structure of an optoelectronic device 104 according to another example embodiment.

The optoelectronic device 104 of the example embodiment is different from the optoelectronic device 100 of FIG. 1 in that the optoelectronic device 104 further includes a hole injection layer (HIL) 180 between the HTL 170 and the second electrode 190, and an electron injection layer (EIL) 120 between the ETL 130 and the first electrode 110.

The HIL 180 may include an organic semiconductor or an inorganic semiconductor. For example, the HIL 180 may include an organic semiconductor such as poly(3,4-ethylenedioxythiophene) (PEDOT) or poly(3,4-ethylenedioxythiophene):polystyrene sulfonate (PEDOT:PSS). In addition, the HIL 180 may include an inorganic semiconductor such as $MoO_3$, NiO, $WO_3$, etc. However, the specific materials of the HIL 180 presented here are examples, and various other materials may be used as the material of the HIL 180. Any general hole injection material used in the field of optoelectronic devices may be applied as the material of the HIL 180. When the electrical conductivity of the HIL 180 is high, the HIL 180 may be regarded as a part of the second electrode 190. In some cases, the HIL 180 may not be provided separately, and the HTL 170 may also serve as the HIL 180.

The EIL 120 may include, for example, LiF, CsF, NaF, $CaF_2$, $Li_2O$, $Cs_2O$, $Na_2O$, $Li_2CO_3$, $Cs_2CO_3$, $Na_2CO_3$, etc. The material of the EIL 120 may be an inorganic material or an organic material. Any electron injection material used in a general optoelectronic device may be applied as the material for the EIL 120. When the electrical conductivity of the EIL 120 is high, the EIL 120 may be regarded as a part of the first electrode 110. In some cases, the EIL 120 may not be provided separately, and the ETL 130 may also serve as the EIL 120.

The optoelectronic device 104 of the example embodiment which further includes the EIL 120 and the HIL 180 is described to include the active layer 150 as in the optoelectronic device 100 of FIG. 1, but is not limited thereto. For example, the EIL 120 and the HIL 180 may be further provided in the optoelectronic devices 101, 102, and 103 of FIGS. 7, 9, and 11.

Hereinafter, results of analyzing the performance of the optoelectronic devices according to related examples and embodiments through computational simulation will be described with reference to FIGS. 14 to 21.

Figure 14:
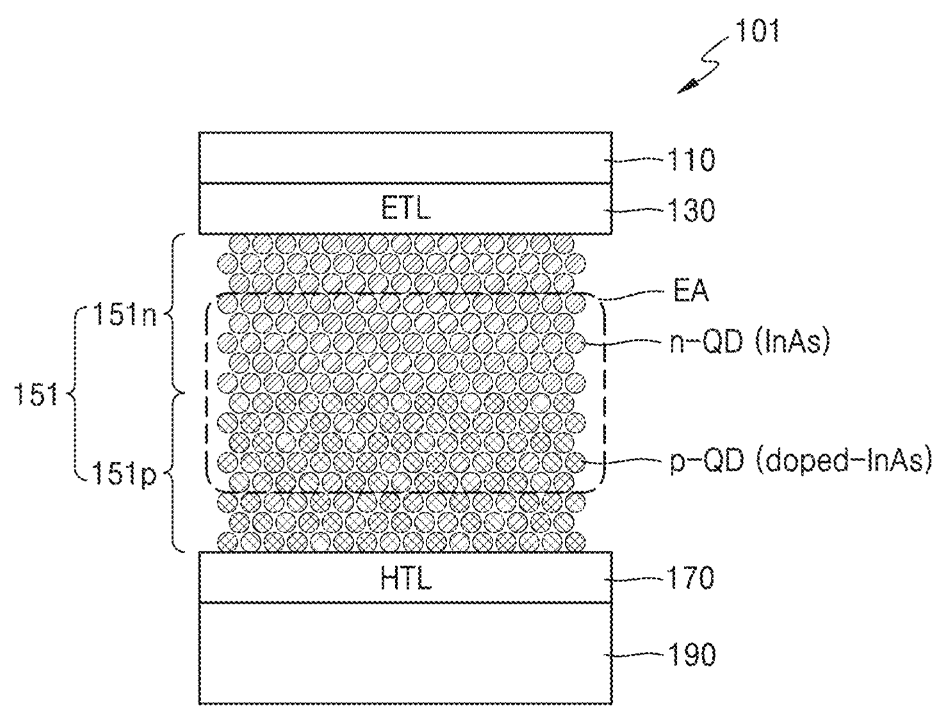
FIG. 14 shows a schematic structure of an optoelectronic device according to an embodiment applied to computational simulation.
Figure 15:
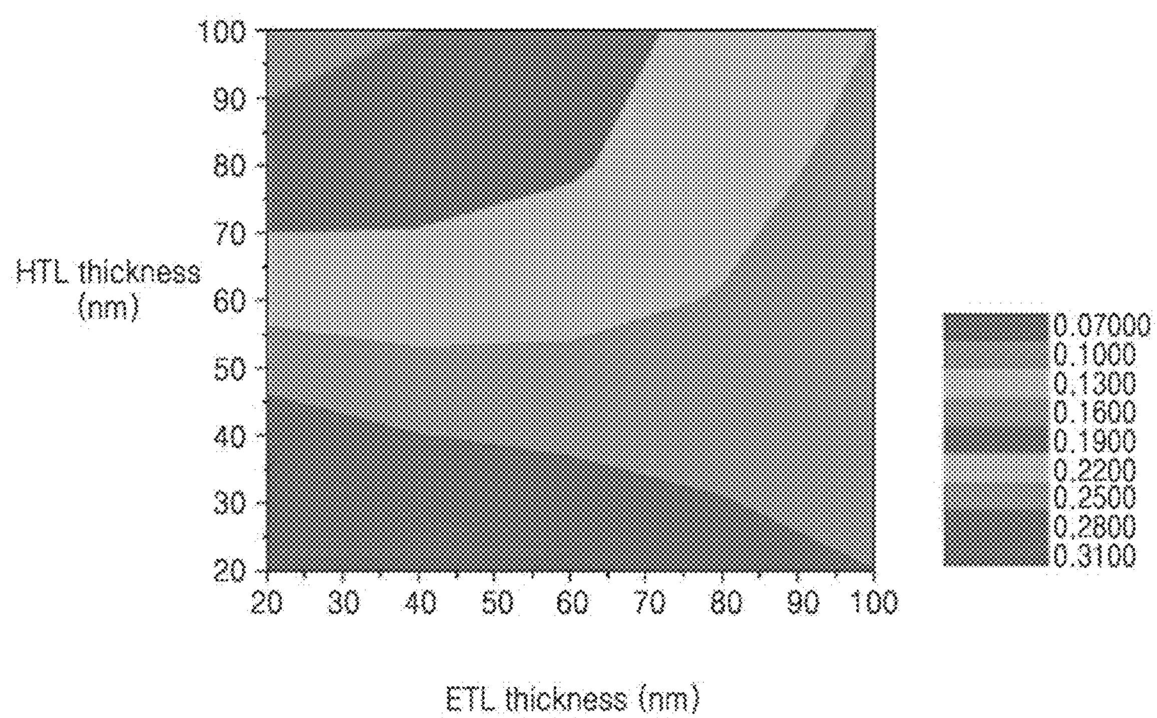
FIG. 15 is a distribution diagram showing external quantum efficiency according to a thickness of an electron transport layer (ETL) and a hole transport layer (HTL) in the optoelectronic device of FIG. 14.

FIG. 14 shows a schematic structure of the optoelectronic device 101 applied to computational simulation according to an example embodiment, and FIG. 15 is a distribution diagram showing external quantum efficiency according to a thickness of an ETL and a HTL in the optoelectronic device 101 of FIG. 14.

In the optoelectronic device 101, the active layer 151 includes the first quantum dot layer 151*p* and the second quantum dot layer 151*n*. The first quantum dot layer 151*p* includes p-type quantum dots (p-QDs), which may be formed by doping quantum dots including InAs with p-type. The second quantum dot layer 151*n* includes n-type quantum dots (n-QDs) including InAs.

The external quantum efficiency is computationally simulated by varying thicknesses of the active layer 151, the ETL, and the HTL, and it is analyzed that the highest external quantum efficiency is 38.9% when thicknesses of the active layer 151, the ETL, and the HTL are 300 nm, 20 nm and 20 nm, respectively.

The distribution diagram of FIG. 15 shows the external quantum efficiency according to the thicknesses of the ETL and the HTL while the thickness of the active layer 151 is fixed to 300 nm. From these results, it may be analyzed that design variables affect an effective active region EA formed near a p-n junction.

Figure 16:
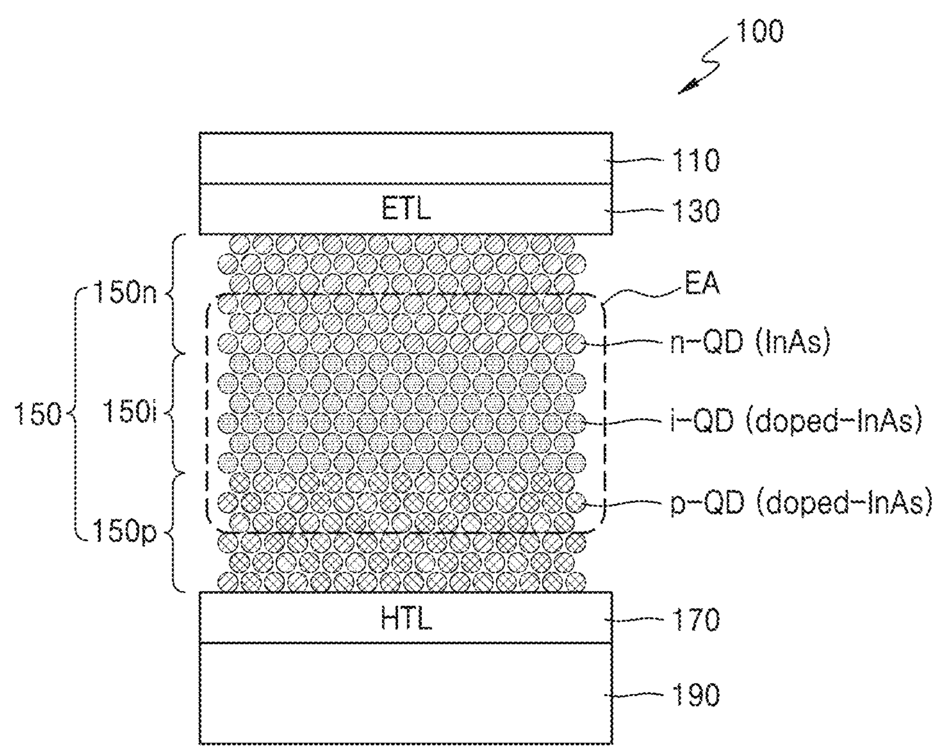
FIG. 16 shows a schematic structure of an optoelectronic device according to another embodiment applied to computational simulation.
Figure 17:
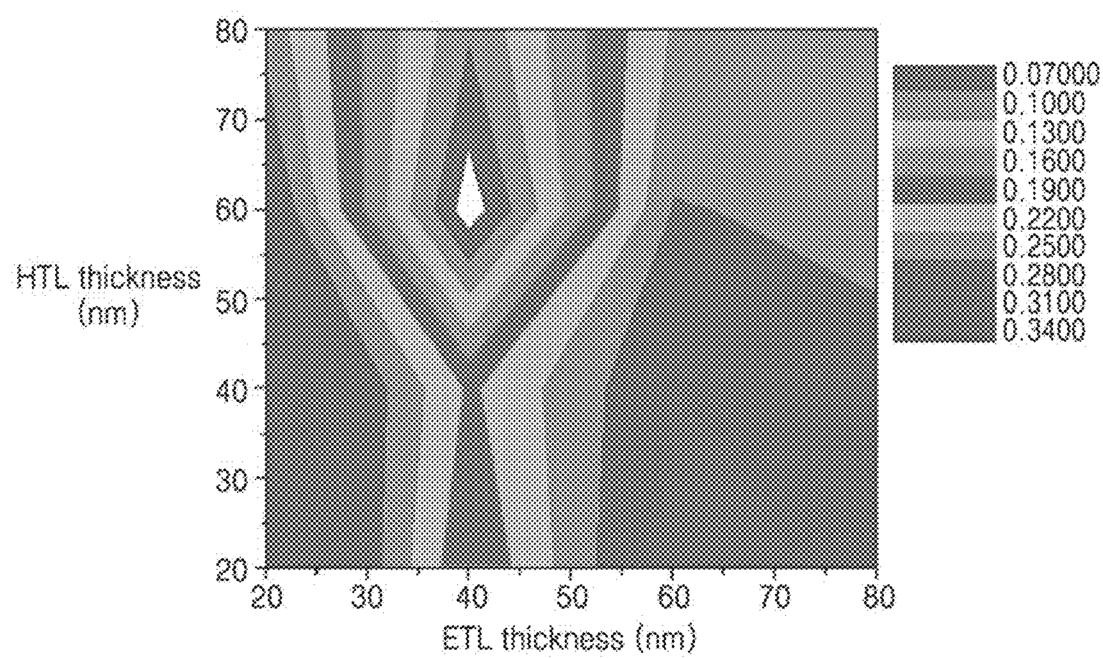
FIGS. 17 and 18 are distribution diagrams showing external quantum efficiency according to thicknesses of an ETL and an HTL by differently fixing a thickness of an active layer in the optoelectronic device of FIG. 16.
Figure 18:
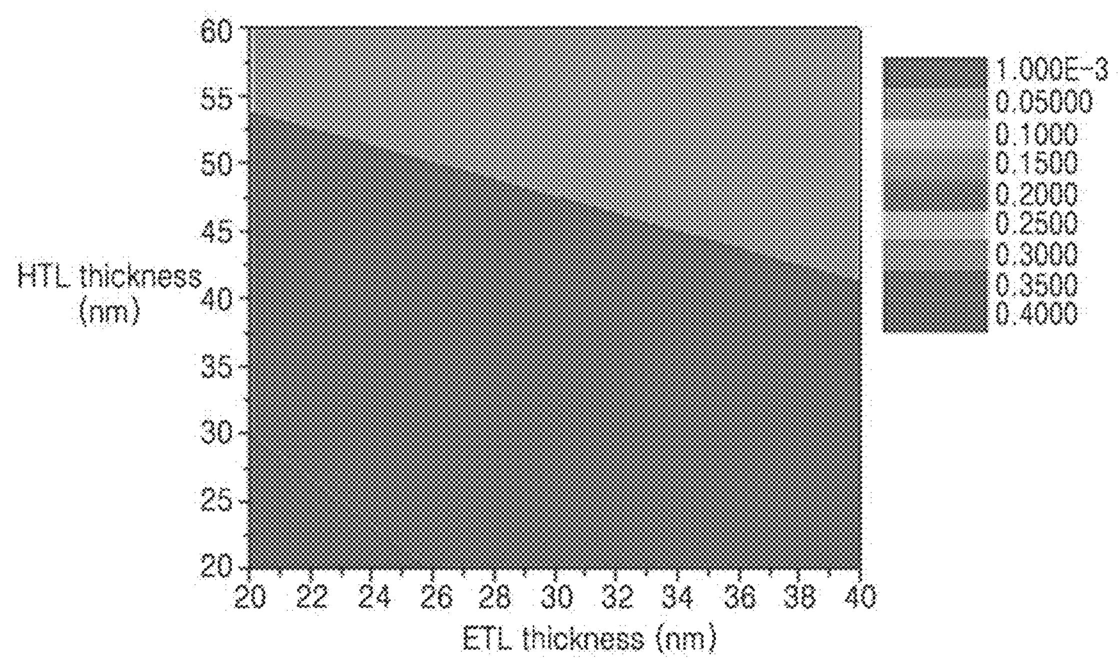

FIG. 16 shows a schematic structure of the optoelectronic device 100 applied to computational simulation according to another example embodiment, and FIGS. 17 and 18 are distribution diagrams showing external quantum efficiency according to thicknesses of an ETL and an HTL by differently fixing a thickness of the active layer 150 in the optoelectronic device 100 of FIG. 16.

In the optoelectronic device 100, the active layer 150 includes the first quantum dot layer 150*p*, the second quantum dot layer 150*n*, and the third quantum dot layer 150*i*. The first quantum dot layer 150*p* includes p-type quantum dots (p-QDs), which may be formed by doping quantum dots including InAs with p-type. The second quantum dot layer 150*n* includes n-type quantum dots (n-QDs) including InAs. The third dot layer 150*i* may be formed by doping essentially n-type InAs QDs at a low concentration with p-type.

The external quantum efficiency is computationally simulated by varying thicknesses of the active layer 151, the ETL, and the HTL.

The distribution diagram of FIG. 17 shows the external quantum efficiency according to the thicknesses of the ETL and the HTL while fixing thicknesses of the first quantum dot layer 150*p*, the second quantum dot layer 150*n*, and the third quantum dot layer 150*i* to 140 nm, 140 nm, and 50 nm, respectively. It is analyzed that the highest external quantum efficiency is 39.8% when the thicknesses of the ETL and the HTL are 20 nm and 20 nm respectively.

The distribution diagram of FIG. 18 shows the external quantum efficiency according to the thicknesses of the ETL and the HTL while fixing thicknesses of the first quantum dot layer 150*p*, the second quantum dot layer 150*n*, and the third quantum dot layer 150*i* to 140 nm, 140 nm, and 200 nm, respectively. It is analyzed that the highest external quantum efficiency is 40.9% when the thicknesses of the ETL and the HTL are 20 nm and 20 nm, respectively.

From these results, it may be analyzed that design variables related to the thicknesses of the ETL, the HTL, and the active layer 150 affect the effective active region EA formed near a p-n junction and an i-n junction.

Figure 19:
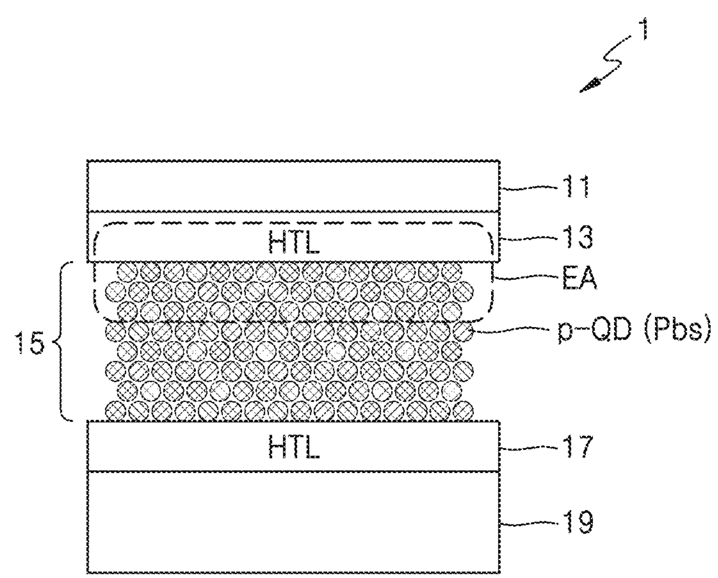
FIG. 19 shows a schematic structure of an optoelectronic device according to a comparative example applied to computational simulation.
Figure 20:
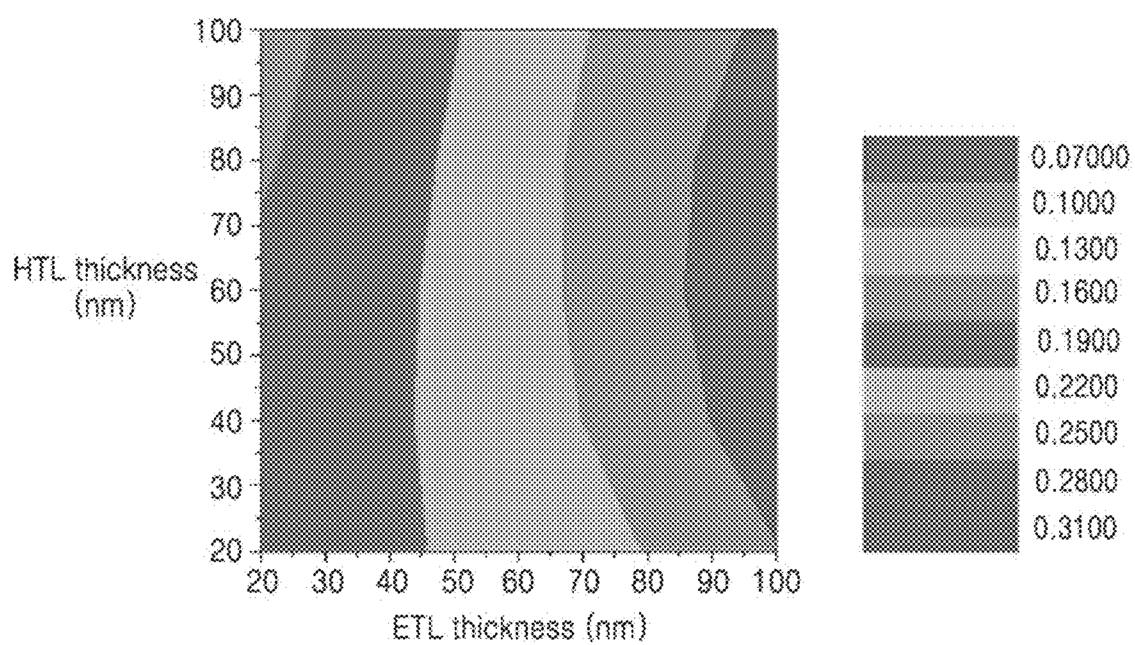
FIG. 20 is a distribution diagram showing external quantum efficiency according to thicknesses of an ETL and an HTL in the optoelectronic device of FIG. 19.

FIG. 19 shows a schematic structure of the optoelectronic device 1 applied to computational simulation according to a related example, and FIG. 20 is a distribution diagram showing external quantum efficiency according to thicknesses of an ETL and an HTL in the optoelectronic device 1 of FIG. 19.

The optoelectronic device 1 of the related example includes p-type quantum dots (p-QDs) in which the active layer 15 includes PbS.

The external quantum efficiency is computationally simulated by varying thicknesses of the active layer 15, the ETL, and the HTL, and it is analyzed that the highest external quantum efficiency is 30.6% when thicknesses of the active layer 15, the ETL, and the HTL are 200 nm, 100 nm and 60 nm, respectively.

The distribution diagram of FIG. 20 shows the external quantum efficiency according to the thicknesses of the ETL and the HTL while the thickness of the active layer 15 is fixed to 200 nm. From these results, it may be analyzed that the design variables affect the effective active region EA formed near an interface between the active layer 15 including the p-type quantum dots and the ETL.

Figure 21:
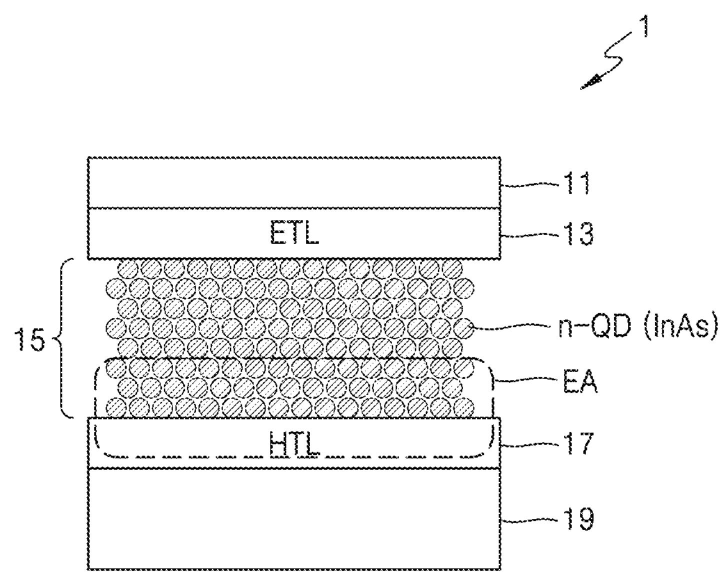
FIG. 21 shows a schematic structure of an optoelectronic device according to another related example applied to computational simulation.
Figure 22:
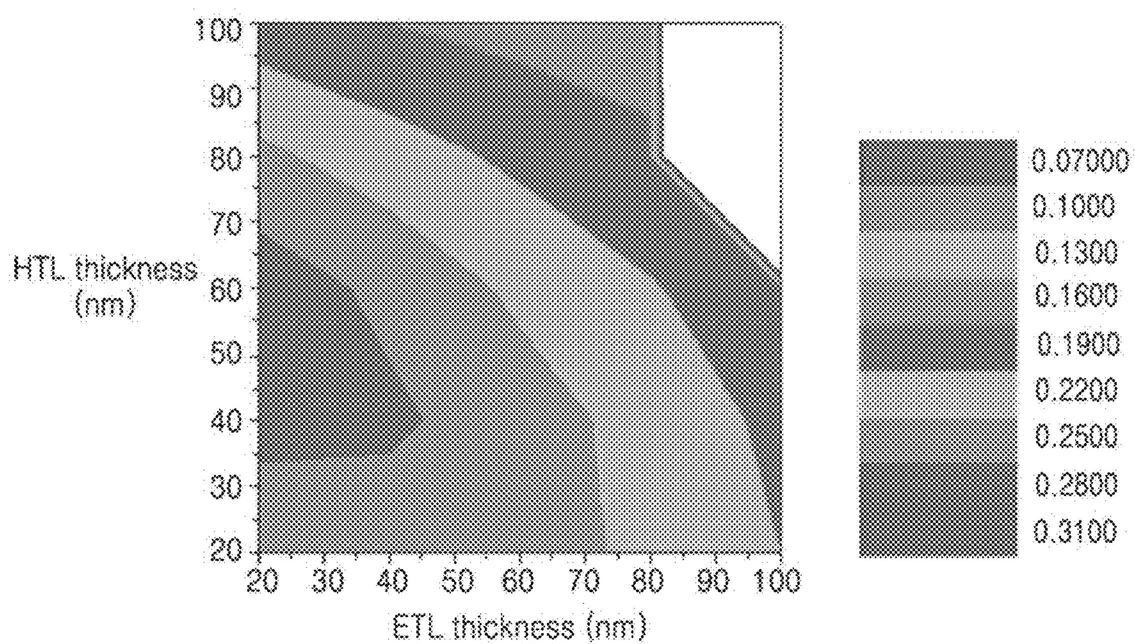
FIG. 22 is a distribution diagram showing external quantum efficiency according to thicknesses of an ETL and an HTL in the optoelectronic device of FIG. 21.

FIG. 21 shows a schematic structure of the optoelectronic device 1 applied to computational simulation according to another related example, and FIG. 22 is a distribution diagram showing external quantum efficiency according to thicknesses of an ETL and an HTL in the optoelectronic device 1 of FIG. 21.

The optoelectronic device 1 of the comparative example includes n-type quantum dots (n-QDs) in which the active layer 15 including InAS.

The external quantum efficiency is computationally simulated by varying thicknesses of the active layer 15, the ETL, and the HTL, and it is analyzed that the highest external quantum efficiency is 29.7% when thicknesses of the active layer 15, the ETL, and the HTL are 250 nm, 20 nm and 60 nm, respectively.

The distribution diagram of FIG. 22 shows the external quantum efficiency according to the thicknesses of the ETL and the HTL while the thickness of the active layer 15 is fixed to 250 nm. From these results, it may be analyzed that the design variables affect the effective active region EA formed near an interface between the active layer 15 including the n-type quantum dots and the HTL.

Upon reviewing the results of the related examples and the example embodiments, the highest external quantum efficiency is greater in the optoelectronic devices according to the example embodiments than in the related examples. This is analyzed because the effective active region EA is formed to be larger in the embodiments than in the related examples.

The above-described optoelectronic device includes an active layer using quantum dots, and a plurality of quantum dot layers having different energy bands are provided in the active layer, thereby exhibiting high external quantum efficiency. The optoelectronic device has an operating wavelength band determined according to the material and size of the quantum dots, and may adjust the operating wavelength band by using quantum dots of the same material and changing only the size. Accordingly, the above-described optoelectronic device may be used as an optical sensor suitable for light of various wavelength bands.

The above-described optoelectronic device may be used as an image sensor of a general camera to obtain a visible light image as well as used as an image sensor suitable for night time and surveillance cameras using near infrared (NIR), short wavelength infrared (SWIR)). In addition, the above-described optoelectronic device may be used as an image sensor suitable for thermal imaging cameras and military cameras that use infrared (mid wavelength infrared (MWIR), long wavelength infrared (LWIR)).

Hereinafter, various image sensors using the above-described optoelectronic device and electronic devices including the same will be described. As described above, the operating wavelength band of the image sensor is adjusted according to the material and size of quantum dots included in the optoelectronic device, and thus the operating wavelength band of the image sensor is not particularly limited in the following description.

Figure 23:
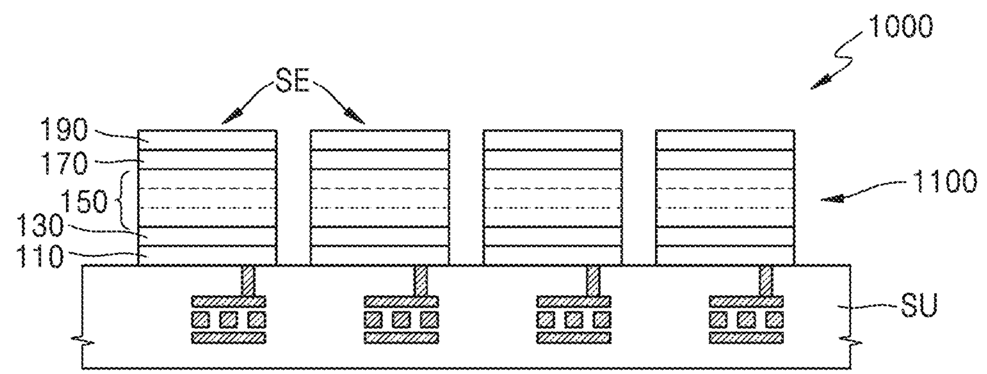
FIG. 23 is a cross-sectional view showing a schematic structure of an image sensor according to an example embodiment.
Figure 24:
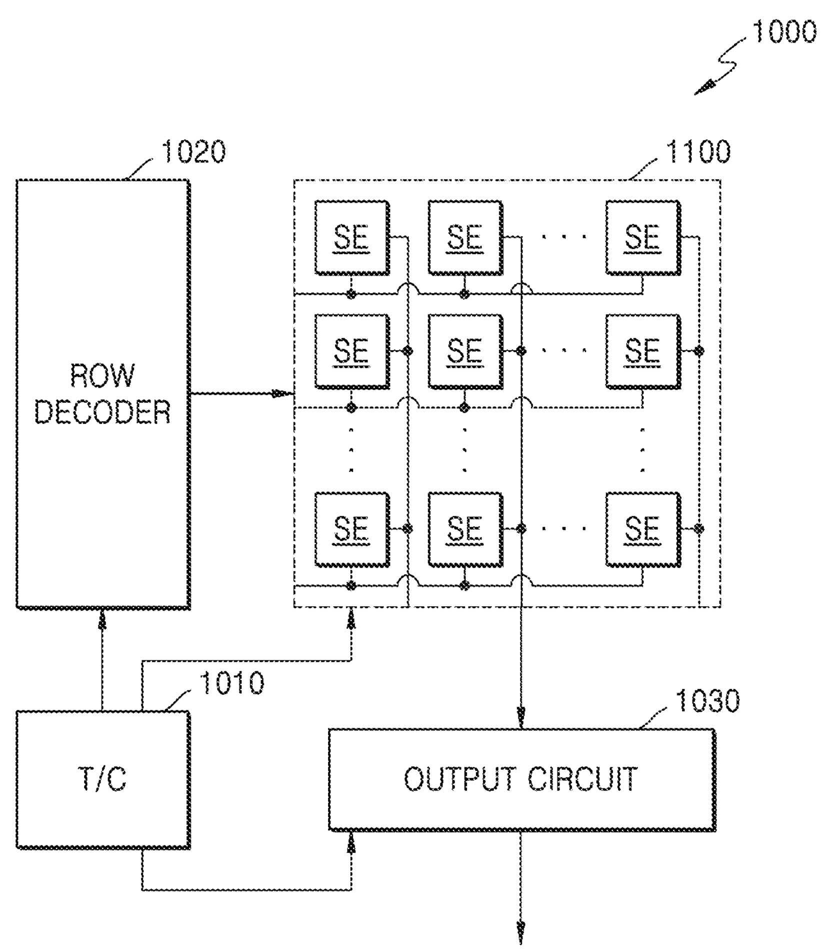
FIG. 24 shows a circuit configuration of an image sensor according to the example embodiment.

FIG. 23 is a cross-sectional view showing a schematic structure of an image sensor 1000 according to an example embodiment, and FIG. 24 shows a circuit configuration of the image sensor 1000 according to the example embodiment.

The image sensor 1000 includes a pixel array 1100 including a plurality of light sensing elements SE. In FIG. 23, the light sensing element SE has the same structure as that of the optoelectronic device 100 of FIG. 1, but is not limited thereto, and a structure of any one of the optoelectronic devices 101, 102, 103, and 104 described with reference to FIGS. 7, 9, 11 and 13 or a structure combined and modified therefrom.

The image sensor 1000 also includes circuit elements respectively connected to the plurality of light sensing elements SE and includes a circuit unit configured to readout an optoelectronic signal generated from each of the plurality of light sensing elements SE. At least a part of the circuit unit may be provided on a circuit substrate SU shown in FIG. 23, and the light sensing elements SE may be arranged on the circuit substrate SU to be connected to the circuit elements in the circuit substrate SU.

The image sensor 1000 may include a pixel array 1100, a timing controller 1010, a row decoder 1020, and an output circuit 1030. The image sensor 1000 may be a charge coupled device (CCD) image sensor or a complementary metal oxide semiconductor (CMOS) image sensor.

The light sensing elements SE constituting the pixel array 1100 may be two-dimensionally arranged along a plurality of rows and columns. Each of these light sensing elements SE may be referred to as a pixel. The row decoder 1020 selects one of the rows of the pixel array 1100 in response to a row address signal output from the timing controller 1010. The output circuit 1030 outputs a light sensing signal from a plurality of pixels arranged along the selected row in a column unit. To this end, the output circuit 1030 may include a column decoder and an analog-to-digital converter (ADC). For example, the output circuit 1030 may include a plurality of ADCs respectively arranged for each column between the column decoder and the pixel array 1100, or one ADC disposed at an output terminal of the column decoder. The timing controller 1010, the row decoder 1020, and the output circuit 1030 may be implemented as a single chip or as separate chips. A processor processing an image signal output through the output circuit 1030 may be implemented as a single chip together with the timing controller 1010, the row decoder 1020, and the output circuit 1030.

Figure 25:
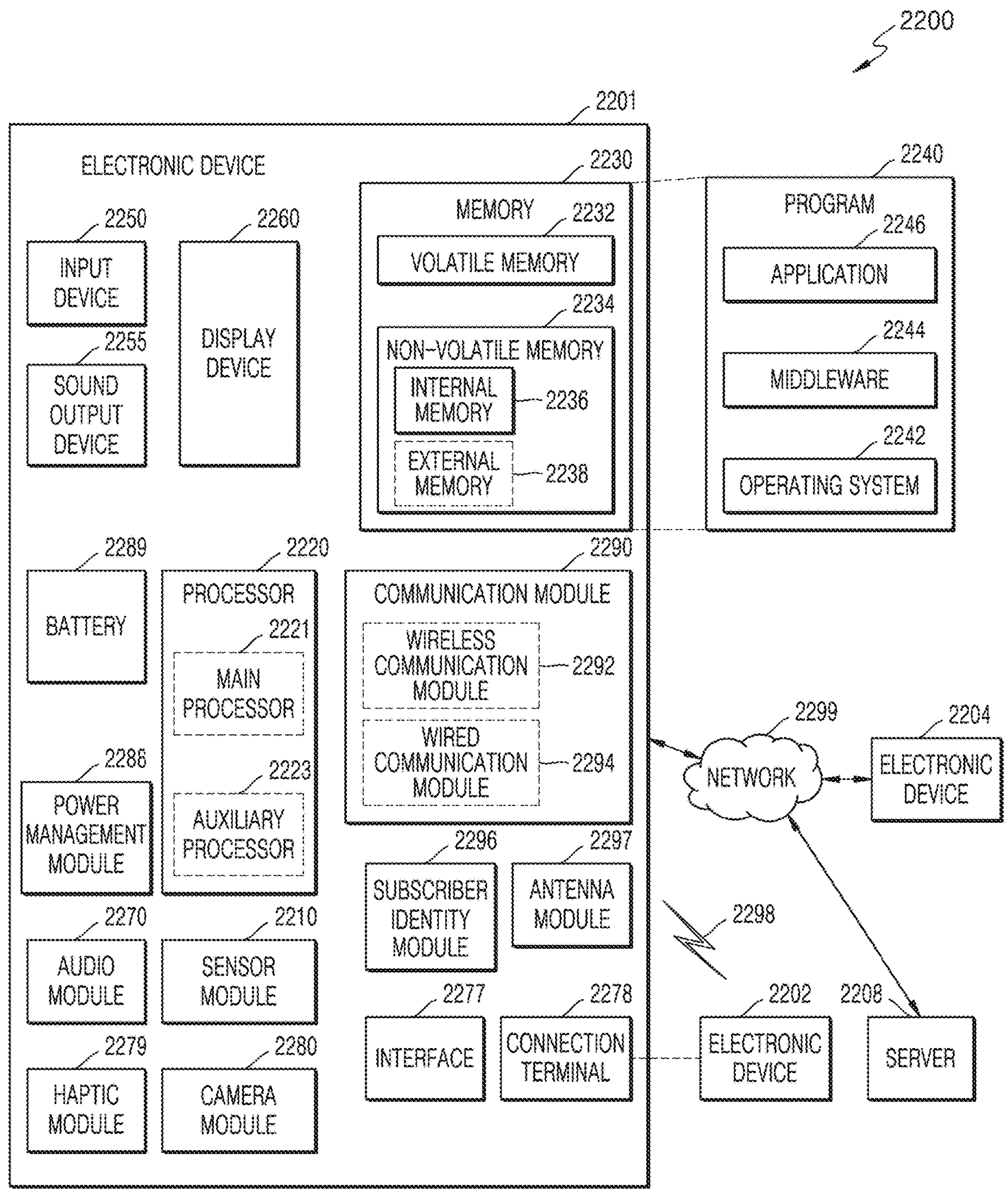
FIG. 25 is a block diagram showing an electronic device including an image sensor according to an example embodiment.

FIG. 25 is a block diagram showing an electronic device 2201 including an image sensor according to an example embodiment.

Referring to FIG. 25, the electronic device 2201 may communicate with another electronic device 2202 through a first network 2298 (local area communication network, etc.) or may communicate with another electronic device 2204 and/or server 2208 through a second network 2299 (far-field communication network, etc.) in a network environment 2200. The electronic device 2201 may communicate with the electronic device 2204 through the server 2208. The electronic device 2201 may include a processor 2220, a memory 2230, an input device 2250, a sound output device 2255, a display device 2260, an audio module 2270, a sensor module 2210, an interface 2277, a haptic module 2279, a camera module 2280, a power management module 2288, a battery 2289, a communication module 2290, a subscriber identity module 2296, and/or an antenna module 2297. Some of these components may be excluded from or other components may be added to the electronic device 2201. Some of these components may be implemented as one integrated circuit. For example, a fingerprint sensor, an iris sensor, an illuminance sensor, etc. of the sensor module 2210 may be embedded in the display device 2260 (a display, etc.)

The processor 2220 may execute software (a program 2240) to control one or a plurality of other constituent elements (hardware and software components, etc.) of the electronic device 2201 connected to the processor 2220 by executing software (a program 2240, and the like), and may perform a variety of data processing or calculations. As part of data processing or operations, the processor 2220 may load commands and/or data received from other components (the sensor module 2210, the communication module 2290, etc.) to a volatile memory 2232, process the commands and/or data stored in the volatile memory 2232, and store resulting data in a non-volatile memory 2234. The processor 2220 may include a main processor 2221 (a central processing unit, an application processor, etc.), and an auxiliary processor 2223 (a graphics processing device, an image signal processor, a sensor hub processor, a communication processor, etc.) that is operable independently from or together with the main processor 2221. The auxiliary processor 2223 may use less power than the main processor 2221, and may perform a specialized function.

The auxiliary processor 2223 may control functions and/or states related to some components (the display device 2260, the sensor module 2210, the communication module 2290, etc.) of the electronic device 2201 instead of the main processor 2221 when the main processor 2221 is in an inactive state (a sleep state), or together with the main processor 2221 when the main processor 2221 is in an active state (an application execution state). The auxiliary processor 2223 (the image signal processor, the communication processor, etc.) may be implemented as part of other functionally related components (the camera module 2280, the communication module 2290, etc.).

The memory 2230 may store a variety of data required by the components (the processor 2220, the sensor module 2210, etc.) of the electronic device 2201. The data may include, for example, software (the program 2240, etc.), and input data and/or output data with respect to commands related to the software. The memory 2230 may include the volatile memory 2232 and/or the non-volatile memory 2234.

The program 2240 may be stored in the memory 8230 as software, and may include an operating system 2242, middleware 2244, and/or an application 2246.

The input device 2250 may receive commands and/or data to be used in the components (the processor 2220, etc.) of the electronic device 2201 from outside (a user, etc.) the electronic device 2201. The input device 2250 may include a microphone, a mouse, a keyboard, and/or a digital pen (a stylus pen).

The sound output device 2255 may output a sound signal to the outside of the electronic device 2201. The sound output device 2255 may include a speaker and/or a receiver. The speaker may be used for general purposes such as multimedia playback or record playback, and the receiver may be used to receive an incoming call. The receiver may be incorporated as a part of the speaker or implemented as an independent separate device.

The display device 2260 may visually provide information to the outside of the electronic device 2201. The display device 2260 may include a display, a hologram device, or a projector, and a control circuit for controlling the corresponding device. The display device 2260 may include touch circuitry set to sense a touch, and/or a sensor circuit (a pressure sensor, etc.) set to measure the intensity of a force generated by the touch. The display device 2260 may include any one of the above-described display devices 1000, 1001, 1002, and 1003, or a display device of a structure modified therefrom. A plurality of display devices 2260 may be provided.

The audio module 2270 may convert sound to an electric signal, or convert the electric signal to sound. The audio module 2270 may obtain sound through the input device 2250, or may output sound through a speaker and/or a headphone of another electronic device (the electronic device 2102, etc.) which is directly or wirelessly connected to the sound output device 2255 and/or the electronic device 2201.

The sensor module 2210 may sense an operating state (power, temperature, etc.) of the electronic device 2201 or an external environment state (a user state, etc.) and may generate an electrical signal and/or a data value corresponding to the sensed state. The sensor module 2210 may include a fingerprint sensor, an acceleration sensor, a location sensor, a 3D sensor, and may further include an iris sensor, a gyro sensor, a pressure sensor, a magnetic sensor, a grip sensor, a proximity sensor, a color sensor, an infrared (IR) sensor, a biometric sensor, a temperature sensor, a humidity sensor, and/or an illuminance sensor.

An interface 2277 may support one or more designated protocols that may be used for directly or wirelessly connecting the electronic device 2201 to another electronic device (the electronic device 2102, etc.). The interface 2277 may include a high definition multimedia interface (HDMI), a universal serial bus (USB) interface, an SD card interface, and/or an audio interface.

A connection terminal 2278 may include a connector used to physically connect the electronic device 2201 with another electronic device (the electronic device 2102, etc.) The connection terminal 2278 may include an HDMI connector, a USB connector, an SD card connector, and/or an audio connector (a headphone connector, etc.)

The haptic module 2279 may convert the electric signal into a mechanical stimulus (vibration, movement, etc.) or an electrical stimulus that may be recognized by the user through tactile sense or kinesthetics. The haptic module 2279 may include a motor, a piezoelectric effect element, and/or an electric stimulation device.

The camera module 2280 may capture still images and moving images. The camera module 2280 may include a lens assembly including one or more lenses, image sensors, image signal processors, and/or flashes. The camera module 2280 may have the above-described image sensor 1000 or a structure modified therefrom, and pixels of the image sensor 1000 may have any one of the above-described optoelectronic devices 100, 101, 102, 103, and 104, a combination thereof, or a structure modified therefrom. A plurality of camera modules 2280 that operate in various wavelength bands may be provided.

The application 2246 may include one or more applications executed in connection with the display device 2260. Such an application 2246 may display additional information suitable for a user environment on the display device 2260. For example, the camera module 2280 may be utilized as a sensor recognizing the user environment, and additional information necessary according to a result of recognition may be displayed on the display device 2260.

The power management module 2288 may manage power supplied to the electronic device 2201. The power management module 2288 may be implemented as part of a power management integrated circuit (PMIC).

The battery 2289 may supply power to the components of the electronic device 2201. The battery 2289 may include a rechargeable primary cell, a rechargeable secondary cell, and/or a fuel cell.

The communication module 2290 may support establishing a direct (wired) communication channel and/or a wireless communication channel between the electronic device 2201 and another electronic device (the electronic devices 2102 and 2104, the server 2108, etc.) and performing communication through the established communication channel. The communication module 2290 may operate independently from the processor 2220 (the application processor, etc.) and may include one or more communication processors that support direct communication and/or wireless communication. The communication module 2290 may include a wireless communication module 2292 (a cellular communication module, a local area communication module, a global navigation satellite system (GNSS) communication module, etc.) and/or a wired communication module 2294 (a local area network (LAN) communication module, a power line communication module, etc.). Among these communication modules, the corresponding communication module may communicate with another electronic device through the first network 2298 (the local area communication network such as Bluetooth, WiFi Direct, or infrared data association (IrDA)) or the second network 2299 (the wide area communication network such as a cellular network, the Internet, or a computer network (a local area network (LAN), a wide area network (WAN), etc.)) A variety of types of communication modules may be integrated into one component (a single chip, etc.), or may be implemented as a plurality of components separate from each other (plural chips). The wireless communication module 2292 may check and authenticate the electronic device 2201 in the communication network such as the first network 2298 and/or the second network 2299 using subscriber information stored in the subscriber identity module 2296 (International mobile subscriber identifier (IMSI), etc.).

The antenna module 2297 may transmit a signal and/or power to the outside (another electronic device, etc.) or receive the signal and/or power from the outside. An antenna may include a radiator including a conductive pattern formed on a substrate (a PCB, etc.). The antenna module 2297 may include one or a plurality of antennas. When a plurality of antennas are included, the communication module 2290 may select an antenna suitable for the communication method used in a communication network such as the first network 2298 and/or the second network 2299 from among the plurality of antennas. Through the selected antenna, a signal and/or power may be transmitted or received between the communication module 2290 and another device. In addition to the antenna, another component (RFIC, etc.) may be included as part of the antenna module 2297.

Some of the components may be connected to each other through communication methods between surrounding devices (a bus, general purpose input and output (GPIO), serial peripheral interface (SPI), mobile industry processor interface (MIPI), etc.) and may interchange signals (commands, data, etc.)

Commands or data may be transmitted or received between the electronic device 2201 and the external electronic device 2204 through the server 2208 connected to the second network 2299. The other electronic devices 2202 and 2204 may be the same as or different from the electronic device 2201. All or some of operations executed by the electronic device 2201 may be executed by one or more of the other electronic devices 2202, 2204, and 2208. For example, when the electronic device 2201 is required to perform a function or a service, instead of executing the function or service on its own, the electronic device 2201 may request the one or more other electronic devices to execute the function or the service partially or wholly. One or more other electronic devices requested to execute the function or the service may execute an additional function or service, and transmit a result of execution to the electronic device 2201. To this end, cloud computing, distributed computing, and/or client-server computing technology may be used.

Figure 26:
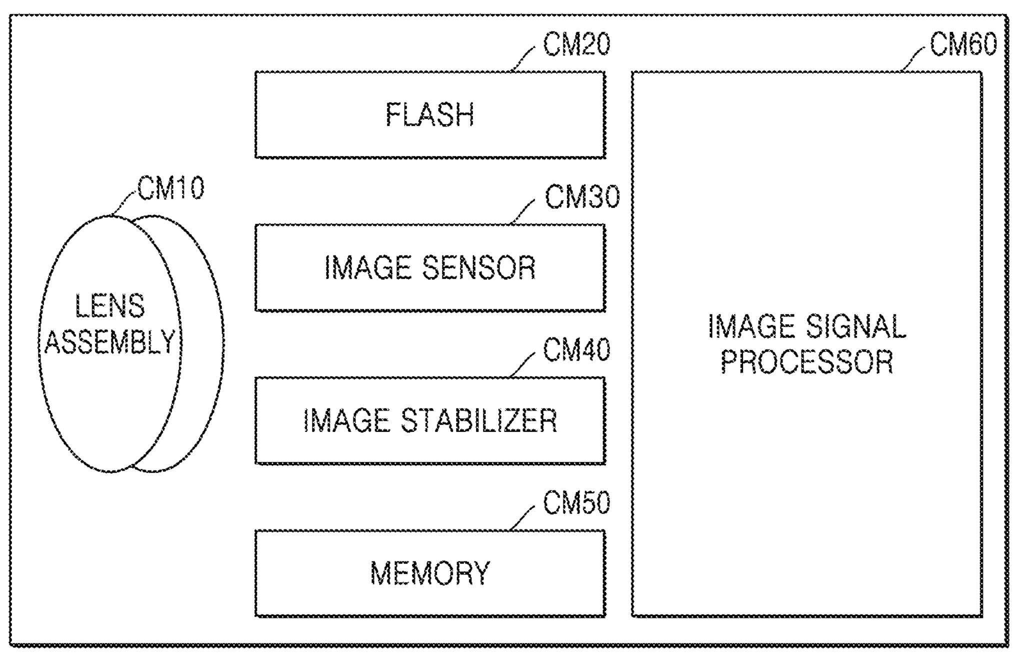
FIG. 26 is a block diagram of a schematic configuration of a camera module included in the electronic device of FIG. 25.

FIG. 26 is a block diagram of a schematic configuration of the camera module 2280 included in the electronic device 2201 of FIG. 25.

Referring to FIG. 26, the camera module 2280 may include a lens assembly CM10, a flash CM20, an image sensor CM30, an image stabilizer CM40, a memory CM50 (a buffer memory, etc.), and/or an image signal processor CM60.

The image sensor CM30 may include a sensor utilizing the above-described optoelectronic devices 100, 101, 102, 103, and 104. The image sensor CM30 may be implemented as an RGB sensor, a black and white (BW) sensor together with a color filter, or may be implemented as an IR sensor or a UV sensor, or may include one or a plurality of sensors selected from image sensors having different attributes. Each of the sensors included in the image sensor CM30 may be implemented as a charged coupled device (CCD) sensor and/or a complementary metal oxide semiconductor (CMOS) sensor, in addition to the sensor utilizing the above-described optoelectronic devices 100, 101, 102, 103, and 104.

The lens assembly CM10 may collect light emitted from an object to be image captured. The camera module 2280 may include a plurality of lens assemblies CM10, and in this case, may be a dual camera, a 360-degree camera, or a spherical camera. Some of the plurality of lens assemblies CM10 may have the same lens properties (angle of view, focal length, autofocus, F Number, optical zoom, etc.) or different lens properties. The lens assembly CM10 may include a wide-angle lens or a telephoto lens.

The flash CM20 may emit light used to enhance light emitted or reflected from an object. The flash CM20 may include one or more light emitting diodes (red-green-blue (RGB) LED, white LED, infrared LED, ultraviolet LED, etc.), and/or a xenon lamp. The flash CM20 may provide light suitable for the operating wavelength band of the image sensor CM30. For example, the flash CM20 may provide a visible light, a near-infrared light, or light in an infrared band.

The image stabilizer CM40 may move one or a plurality of lenses or the image sensor 1000 included in the lens assembly CM10 in a specific direction in response to movement of the camera module 2280 or an electronic device 2201 including the same, or may control an operating characteristic of the image sensor 1000 (adjustment of read-out timing, etc.) such that a negative effect due to movement is compensated. The image stabilizer CM40 may detect movement of the camera module 2280 or the electronic device 2201 using a gyro sensor (not shown) or an acceleration sensor (not shown) arranged inside or outside the camera module 2280. The image stabilizer CM40 may be implemented optically.

In the memory CM50, some or all of the data obtained through the image sensor 1000 may be stored for the next image processing operation. For example, when a plurality of images are obtained at high speed, the obtained original data (Bayer-patterned data, high-resolution data, etc.) may be stored in the memory CM50 and only a low-resolution image is displayed, and then the memory CM50 may be used to transfer the original data of a selected image (user selection, etc.) may be transferred to the image signal processor CM60. The memory CM50 may be integrated into the memory 2230 of the electronic device 2201 or may be configured as a separate memory that is independently operated.

The image signal processor CM60 may perform image processing operations on an image obtained through the image sensor CM30 or image data stored in the memory CM50.

The image processing operations may include depth map generation, three-dimensional modeling, panorama generation, feature point extraction, image synthesis, and/or image compensation (noise reduction, resolution adjustment, brightness adjustment, blurring, sharpening, softening, etc.) The image signal processor CM60 may control (exposure time control, or read-out timing control, etc.) components (the image sensor CM30, etc.) included in the camera module 2280. An image processed by the image signal processor CM60 may be stored again in the memory CM50 for further processing or may be provided to external components (the memory 2230, the display device 2260, the electronic device 2202, the electronic device 2204, the server 2208, etc.) of the camera module 2280. The image signal processor CM60 may be integrated into the processor CM20 or may be configured as a separate processor that operates independently of the processor CM20. When the image signal processor CM60 is configured as a separate processor from the processor 2220, an image processed by the image signal processor CM60 may be displayed through the display device CM60 after further image processing by the processor 2220.

The electronic device 2201 may include a plurality of camera modules 2280 having respective attributes or functions. In this case, one of the plurality of camera modules 2280 may be a wide-angle camera, and the other may be a telephoto camera. Similarly, one of the plurality of camera modules 2280 may be a front camera, and the other may be a rear camera.

The image sensor according to example embodiment may be applied to various electronic devices.

Figure 27:
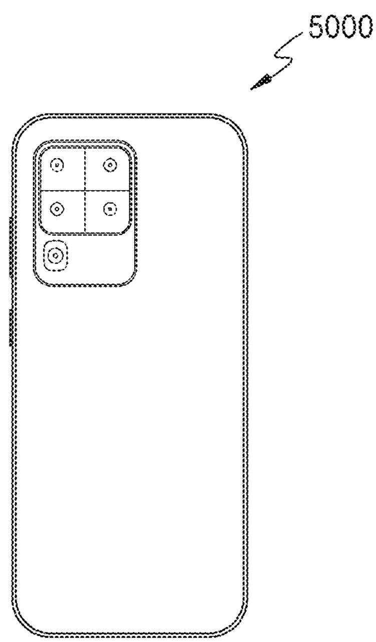
FIGS. 27 and 28 show examples of an electronic device to which an image sensor according to an example embodiment is applied.
Figure 28:
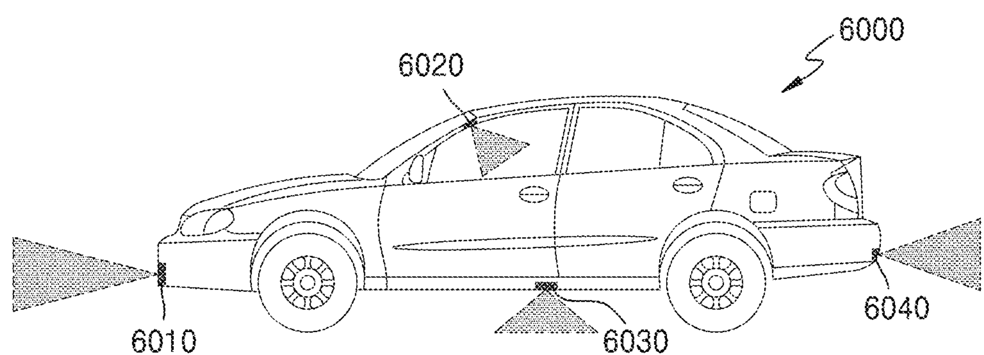

FIGS. 27 and 28 show examples of an electronic device to which an image sensor is applied according to an example embodiment.

The image sensor according to example embodiments may be applied to various types of cameras provided in a mobile phone or a smart phone 5000 illustrated in FIG. 27.

Also, the image sensor according to example embodiments may be applied to a vehicle 6000 as shown in FIG. 28. The vehicle 6000 may include a plurality of vehicle cameras 6010, 6020, 6030, and 6040 arranged at various positions. Each of the vehicle cameras 6010, 6020, 6030, and 6040 may include an image sensor using the optoelectronic device 100, 101, 102, 103, or 104 according to an example embodiment. Some of the plurality of vehicle cameras 6010, 6020, 6030, and 6040 provided in the vehicle 6000 may be cameras obtaining a visible light image, and the others may be cameras obtaining an infrared image for night use. The plurality of vehicle cameras 6010, 6020, 6030, and 6040A may be utilized to provide a variety of information about the interior or surroundings of the vehicle 6000 to a driver, and automatically recognize objects or persons in images to provide information necessary for autonomous driving.

In addition, the above-described image sensor may be provided in a personal digital assistant (PDA), a laptop, a personal computer (PC), home appliance, a security camera, a military camera, a medical camera, or an Internet of Things (IoT) device, a virtual reality device, an augmented reality device, etc. The cameras mounted on these devices may be used to obtain images in various environments, such as a dark environment and an environment that may not be directly accessed by human, etc. and automatically identify subjects in the images. In addition, the augmented reality device may recognize a user environment and provide an additional image suitable for the user environment.

The above-described optoelectronic device may include an active layer using quantum dots to easily adjust an operating wavelength band according to the size of quantum dots so that optoelectronic devices may be used as an optical sensor suitable for light of various wavelength bands.

The above-described optoelectronic device may include a plurality of quantum dot layers having different energy bands in the active layer, thereby exhibiting high external quantum efficiency.

The above-described optoelectronic device may provide an image sensor applicable to various wavelength bands. These image sensors may be used not only for cameras that provide visible light images, but also for nighttime and crime prevention cameras using near-infrared rays, thermal imaging cameras using infrared rays, etc.

The camera module including the above-described image sensor may be used in various electronic devices.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. An optoelectronic device comprising:

a first electrode;

a second electrode spaced apart from the first electrode;

an active layer provided between the first electrode and the second electrode, the active layer comprising a plurality of quantum dot layers having different energy bands, the active layer comprising a p-type first quantum dot layer, an n-type second quantum dot layer, an intrinsic-type (i-type) third quantum dot layer provided between the p-type first quantum dot layer and the n-type second quantum dot layer;

an electron transport layer provided between the first electrode and the active layer; and a hole transport layer provided between the active layer and the second electrode;

wherein a thickness of the electron transport layer and a thickness of the hole transport layer are determined such that a maximum external quantum efficiency of the optoelectronic device is obtained at a value that is higher than 35%.

2. The optoelectronic device of claim 1, wherein the plurality of quantum dot layers comprise a same quantum dot material.

3. The optoelectronic device of claim 2, wherein the plurality of quantum dot layers are doped with different dopants.

4. The optoelectronic device of claim 2, wherein one layer of the plurality of quantum dot layers is doped with a certain dopant, and other layers of the plurality of quantum dot layers are undoped.

5. The optoelectronic device of claim 1, wherein the plurality of quantum dot layers comprise different quantum dot materials.

6. The optoelectronic device of claim 1, further comprising:

an electron transport layer provided between the first electrode and the active layer; and a hole transport layer provided between the active layer and the second electrode.

7. The optoelectronic device of claim 6, wherein a thickness of the active layer ranges from 250 nm to 350 nm.

8. The optoelectronic device of claim 7, wherein a thickness of the electron transport layer and a thickness of the hole transport layer ranges from 10 nm to 100 nm.

9. The optoelectronic device of claim 7, wherein a thickness of the electron transport layer ranges from 20 nm to 60 nm, and a thickness of the hole transport layer ranges from 20 nm to 35 nm.

10. The optoelectronic device of claim 1, wherein the active layer further comprises an intrinsic-type (i-type) third quantum dot layer provided between the p-type first quantum dot layer and the n-type second quantum dot layer.

11. The optoelectronic device of claim 10, further comprising:

an electron transport layer provided between the first electrode and the active layer; and a hole transport layer provided between the active layer and the second electrode.

12. The optoelectronic device of claim 11, wherein a thickness of the active layer ranges from 300 nm to 600 nm.

13. The optoelectronic device of claim 12, wherein a thickness of the electron transport layer ranges from 20 nm to 30 nm, and a thickness of the hole transport layer ranges from 20 nm to 50 nm.

14. The optoelectronic device of claim 10, wherein the active layer further comprises:

a p-type fourth quantum dot layer provided between the p-type first quantum dot layer and the i-type third quantum dot layer, a doping concentration of the p-type fourth quantum dot layer being lower than a doping concentration of the p-type first quantum dot layer; and an n-type fifth quantum dot layer provided between the i-type third quantum dot layer and the n-type second quantum dot layer, a doping concentration of the n-type fifth quantum dot layer being lower than a doping concentration of the n-type second quantum dot layer.

15. The optoelectronic device of claim 1, wherein the active layer further comprises:

a p-type fourth quantum dot layer provided between the p-type first quantum dot layer and the n-type second quantum dot layer, a doping concentration of the p-type fourth quantum dot layer being lower than a doping concentration of the p-type first quantum dot layer; and an n-type fifth quantum dot layer provided between the p-type fourth quantum dot layer and the n-type second quantum dot layer, a doping concentration of the n-type fifth quantum dot layer being lower than a doping concentration of the n-type second quantum dot layer.

16. The optoelectronic device of claim 1, wherein one of the first electrode and the second electrode comprises a transparent conductive material.

17. The optoelectronic device of claim 1, wherein one layer of the plurality of quantum dot layers is doped with a metal ion, a ligand material, or an inorganic ion passivation.

18. The optoelectronic device of claim 1, wherein a diameter of a quantum dot included in each of the plurality of quantum dot layers ranges from 1 nm to 10 nm.

19. The optoelectronic device of claim 1, wherein the active layer forms a photocarrier based on light of a visible, near-infrared or infrared wavelength band.

20. An image sensor comprising:

a sensor array comprising a plurality of light-sensors respectively comprising an optoelectronic device, the optoelectronic device comprising:

a first electrode;

a second electrode spaced apart from the first electrode;

an active layer provided between the first electrode and the second electrode, the active layer comprising a plurality of quantum dot layers having different energy bands, the active layer comprising a p-type first quantum dot layer, an n-type second quantum dot layer, an intrinsic-type (i-type) third quantum dot layer provided between the p-type first quantum dot layer and the n-type second quantum dot layer;

an electron transport layer provided between the first electrode and the active layer; and a hole transport layer provided between the active layer and the second electrode;

wherein a thickness of the electron transport layer and a thickness of the hole transport layer are determined such that a maximum external quantum efficiency of the optoelectronic device is obtained at a value that is higher than 35%; and a circuit comprising circuits respectively connected to the plurality of light-sensors and configured to readout an optoelectronic signal generated from each of the plurality of light-sensors.

21. An electronic device comprising:

an imaging device configured to form an optical image by focusing light reflected from a subject; and an image sensor configured to convert the optical image formed by the imaging device into an electrical signal, the image sensor comprising:

a sensor array comprising a plurality of light-sensors respectively comprising an optoelectronic device, the optoelectronic device comprising:

a first electrode;

a second electrode spaced apart from the first electrode;

an active layer provided between the first electrode and the second electrode, the active layer comprising a plurality of quantum dot layers having different energy bands, the active layer comprising a p-type first quantum dot layer, an n-type second quantum dot layer, an intrinsic-type (i-type) third quantum dot layer provided between the p-type first quantum dot layer and the n-type second quantum dot layer;

an electron transport layer provided between the first electrode and the active layer; and a hole transport layer provided between the active layer and the second electrode;

wherein a thickness of the electron transport layer and a thickness of the hole transport layer are determined such that a maximum external quantum efficiency of the optoelectronic device is obtained at a value that is higher than 35%; and a circuit comprising circuits respectively connected to the plurality of light-sensors and configured to readout an optoelectronic signal generated from each of the plurality of light-sensors.

22. The electronic device of claim 21, wherein the electronic device comprises a smart phone, a mobile phone, a personal digital assistant (PDA), a laptop, a personal computer (PC), a home appliance, a security camera, a medical camera, a vehicle, an Internet of Things (IoT) device, a virtual reality device, or an augmented reality device.

* * * * *